(12) United States Patent
Huang et al.

(10) Patent No.: US 11,476,196 B2
(45) Date of Patent: Oct. 18, 2022

(54) SEMICONDUCTOR DEVICE WITH MULTI-LAYER DIELECTRIC

(71) Applicant: Taiwan Semiconductor Manufacturing Co., Ltd., Hsinchu (TW)

(72) Inventors: Lin-Yu Huang, Hsinchu (TW); Sheng-Tsung Wang, Hsinchu (TW); Jia-Chuan You, Taoyuan County (TW); Chia-Hao Chang, Hsinchu (TW); Tien-Lu Lin, Hsinchu (TW); Yu-Ming Lin, Hsinchu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 166 days.

(21) Appl. No.: 16/597,205

(22) Filed: Oct. 9, 2019

(65) Prior Publication Data

US 2020/0168555 A1 May 28, 2020

Related U.S. Application Data

(60) Provisional application No. 62/771,626, filed on Nov. 27, 2018.

(51) Int. Cl.
*H01L 23/532* (2006.01)
*H01L 29/78* (2006.01)
(Continued)

(52) U.S. Cl.
CPC .... *H01L 23/53295* (2013.01); *H01L 21/7682* (2013.01); *H01L 23/5226* (2013.01);
(Continued)

(58) Field of Classification Search
None
See application file for complete search history.

(56) References Cited

U.S. PATENT DOCUMENTS 7,923,820 B2 * 4/2011 Jeannot ............... H01L 21/3121
257/642
8,772,109 B2 7/2014 Colinge
(Continued)

*Primary Examiner* — Telly D Green
(74) *Attorney, Agent, or Firm* — Haynes and Boone, LLP

(57) ABSTRACT

Semiconductor device and the manufacturing method thereof are disclosed herein. An exemplary semiconductor device comprises a fin disposed over a substrate, a gate structure disposed over a channel region of the fin, such that the gate structure traverses source/drain regions of the fin, a device-level interlayer dielectric (ILD) layer of a multi-layer interconnect structure disposed over the substrate, wherein the device-level ILD layer includes a first dielectric layer, a second dielectric layer disposed over the first dielectric layer, and a third dielectric layer disposed over the second dielectric layer, wherein a material of the third dielectric layer is different than a material of the second dielectric layer and a material of the first dielectric layer. The semiconductor device further comprises a gate contact to the gate structure disposed in the device-level ILD layer and a source/drain contact to the source/drain regions disposed in the device-level ILD layer.

20 Claims, 17 Drawing Sheets

(51) Int. Cl.
*H01L 21/768* (2006.01)
*H01L 29/40* (2006.01)
*H01L 23/522* (2006.01)
*H01L 29/417* (2006.01)

(52) U.S. Cl.
CPC ...... *H01L 29/401* (2013.01); *H01L 29/41791* (2013.01); *H01L 29/785* (2013.01)

(56) References Cited

U.S. PATENT DOCUMENTS

| | | | |
|---|---|---|---|
| 8,785,285 B2 | 7/2014 | Tsai et al. | |
| 8,816,444 B2 | 8/2014 | Wann et al. | |
| 8,816,492 B1 * | 8/2014 | Minervini | B81B 7/0077 257/701 |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 9,646,973 B2 * | 5/2017 | Liaw | H01L 29/665 |
| 9,735,047 B1 * | 8/2017 | Chang | H01L 21/7682 |
| 10,020,401 B2 * | 7/2018 | Wu | H01L 21/28158 |
| 10,074,558 B1 * | 9/2018 | Tsai | H01L 23/53209 |
| 10,157,987 B1 * | 12/2018 | Liaw | H01L 29/7848 |
| 10,943,829 B2 * | 3/2021 | Huang | H01L 29/66795 |
| 2013/0221441 A1 * | 8/2013 | Jagannathan | H01L 21/845 257/350 |
| 2016/0197175 A1 * | 7/2016 | Lee | H01L 29/6656 257/288 |
| 2016/0284712 A1 * | 9/2016 | Liaw | H01L 29/665 |
| 2018/0040615 A1 * | 2/2018 | Chang | H01L 21/823431 |
| 2018/0151740 A1 * | 5/2018 | Wu | H01L 21/28158 |
| 2020/0006230 A1 * | 1/2020 | Tsai | H01L 21/76879 |
| 2020/0126865 A1 * | 4/2020 | Huang | H01L 29/66545 |

* cited by examiner

SEMICONDUCTOR DEVICE WITH MULTI-LAYER DIELECTRIC

This is a non-provisional application of and claims benefit of U.S. Provisional Patent Application Ser. No. 62/771,626, filed Nov. 27, 2018, the entire disclosure of which is incorporated herein by reference.

BACKGROUND

The electronics industry has experienced an ever-increasing demand for smaller and faster electronic devices which are simultaneously able to support a greater number of increasingly complex and sophisticated functions. These goals have been achieved by scaling down semiconductor IC dimensions (e.g., minimum feature size) and thereby improving production efficiency and lowering associated costs. However, such scaling has also introduced increased complexity to the semiconductor manufacturing process. Multi-gate devices have been introduced to improve gate control, reduce OFF-state current, and reduce short-channel effects (SCEs). Multi-gate devices are compatible with conventional complementary metal-oxide-semiconductor (CMOS) processes and their three-dimensional structure allows them to be aggressively scaled while maintaining gate control and mitigating SCEs. However, aggressive scaling down of IC dimensions has resulted in decreased distance between contacts. When the mask slots are too close to meet the resolution limit, metal contact bridge may be formed and cause poor device performance. In addition, single layer interlayer dielectric (ILD) may cause small contact to contact TDDB window and shorten the device life. Thus, existing techniques have not proved entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-14A illustrate planar top views of the example semiconductor device at intermediate stages of the method of FIG. 1 in accordance with some embodiments of the present disclosure;

FIGS. 3B-14B illustrate cross-sectional views along plane B-B' shown in FIGS. 3A-14A of the example semiconductor device at intermediate stages of the method of FIG. 1 in accordance with some embodiments of the present disclosure;

FIGS. 3C-14C illustrate cross-sectional views along plane C-C' shown in FIGS. 3A-14A of the example semiconductor device at intermediate stages of the method of FIG. 1 in accordance with some embodiments of the present disclosure;

FIGS. 3D-14D illustrate cross-sectional views along plane D-D' shown in FIGS. 3A-14A of the example semiconductor device at intermediate stages of the method of FIG. 1 in accordance with some embodiments of the present disclosure;

DETAILED DESCRIPTION

Figure 1:
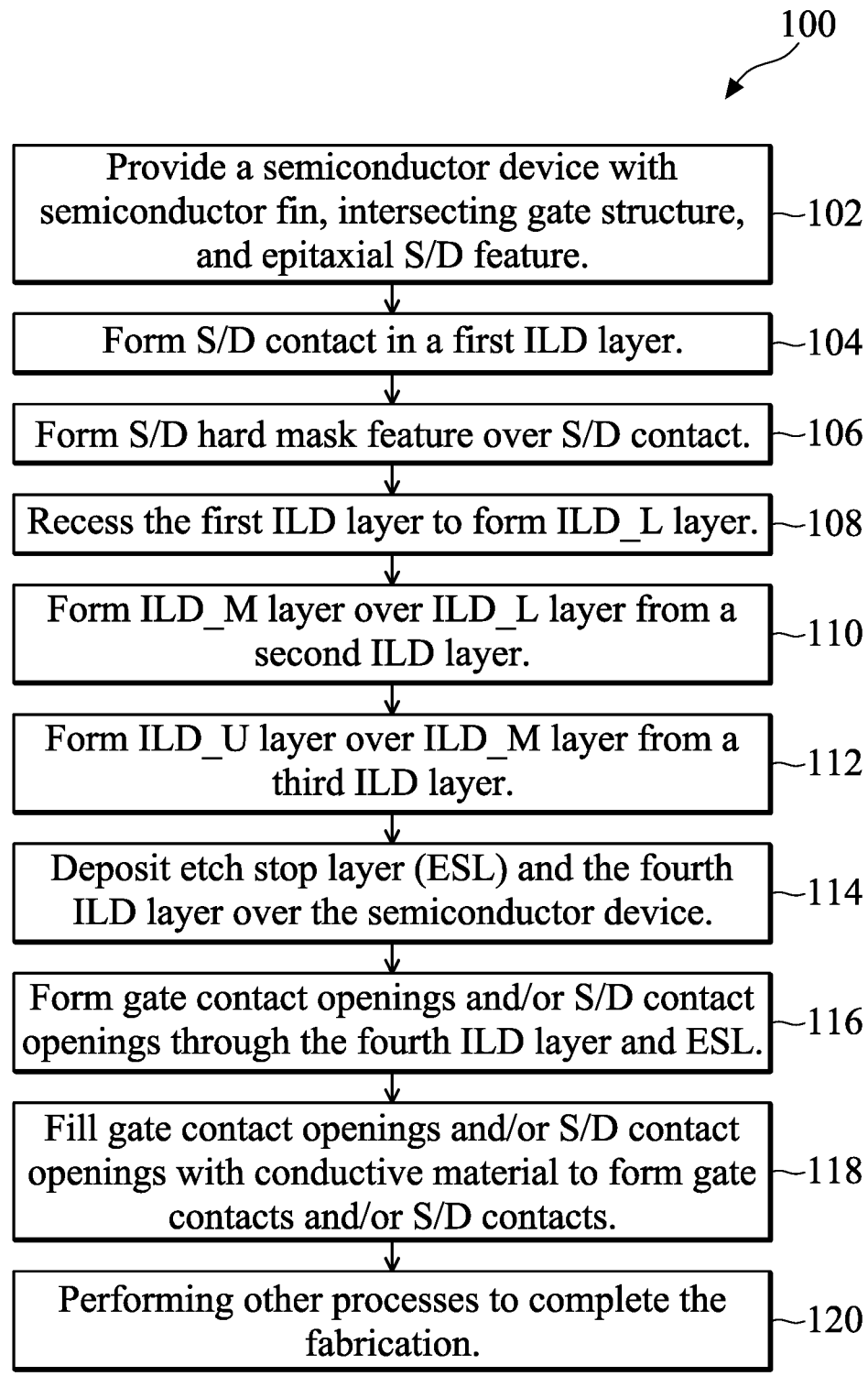
FIG. 1 illustrates a flowchart of an example method for making a semiconductor device in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices and the fabrication thereof, and more particularly to methods of fabricating field-effect transistors (FETs), such as multi-gate devices.

One such multi-gate device that has been introduced is the fin field-effect transistor (FinFET). The FinFET gets its name from the fin-like structure which extends from a substrate on which it is formed, and which is used to form the FET channel. In a FinFET device, a channel region of a single device may include multiple layers of semiconductor material of physically separated from one another, and a gate of the device is disposed above, alongside, and even between the semiconductor layers of the device. This configuration is called gate-all-around (GAA) devices, which allow more aggressive gate length scaling for both performance and density improvement. The present disclosure is generally related to formation of multi-gate devices, including FinFETs and GAA devices, wherein a three-layer interlayer dielectric (ILD) feature is formed to provide selectivity when forming gate contact or source/drain (S/D) contact to avoid the metal bridge issue. In addition, the three layers structure of the three-layer ILD feature can provides better contact to contact time-dependent dielectric breakdown (TDDB) window so as to extend the device life. Of course, these advantages are merely exemplary, and no particular advantage is required for any particular embodiment.

Figure 2:
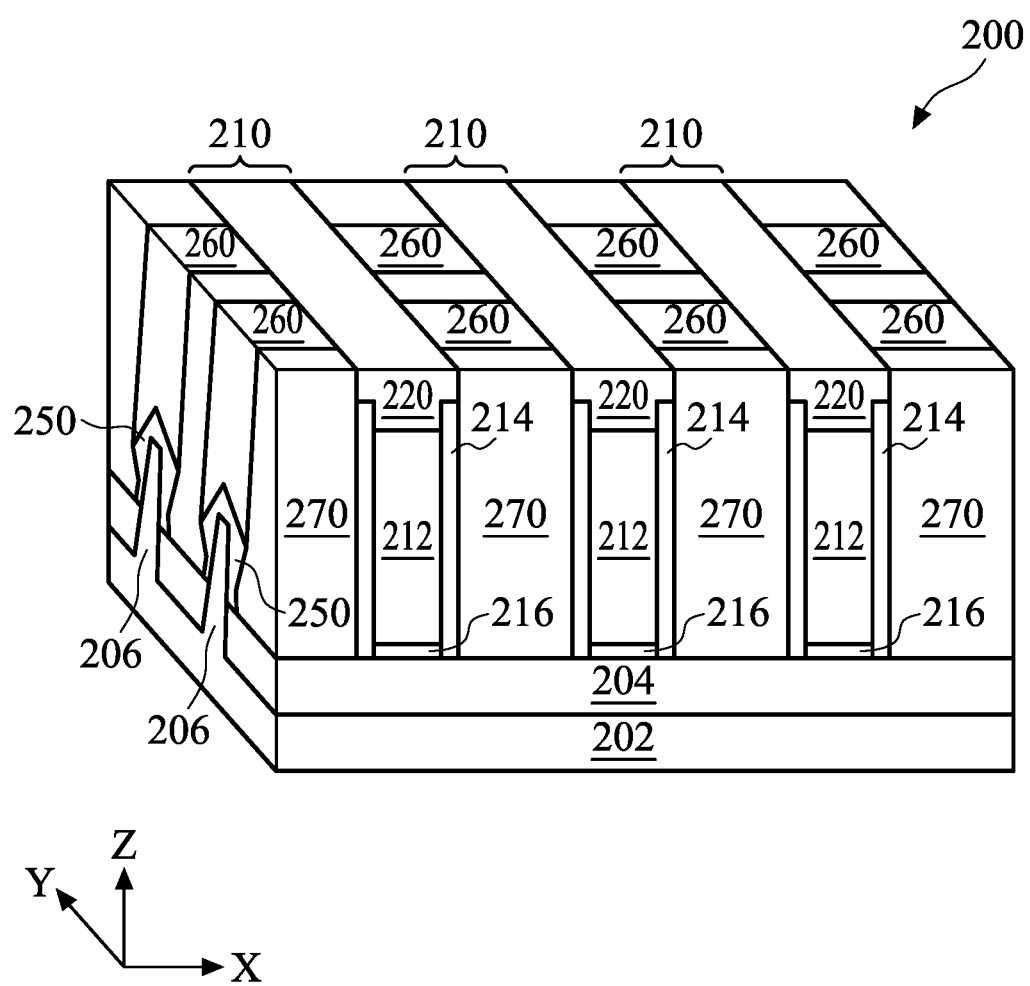
FIG. 2 illustrates a three-dimensional perspective view of an example semiconductor device in accordance with some embodiments of the present disclosure.

FIG. 1 illustrates a flow chart of a method 100 for forming a semiconductor device 200 (hereafter called device 200) in accordance with some embodiments of the present disclosure. Method 100 is merely an example and is not intended to limit the present disclosure beyond what is explicitly recited in the claims. Additional operations can be performed before, during, and after method 100, and some operations described can be replaced, eliminated, or moved around for additional embodiments of the method. Method 100 is described below in conjunction with other figures, which illustrate various three-dimensional, planar top views, and cross-sectional views of device 200 during intermediate steps of method 100. In particular, FIG. 2 illustrates a three-dimensional view of device 200. FIGS. 3A-14A illustrate planar top views of device 200 at intermediate stages of the method of FIG. 1 in accordance with some embodiments of the present disclosure. FIGS. 3B-14B illustrate cross-sectional views of device 200 taken along plane B-B' in FIGS. 3A-14A (that is, along an x-direction); FIGS. 3C-14C illustrate cross-sectional views of device 200 taken along plane C-C' in FIGS. 3A-14A (that is, along an x-direction), and FIGS. 3D-14D illustrate cross-sectional views of device 200 taken along plane D-D' in FIGS. 3A-14A (that is, along a y-direction).

Device 200 may be an intermediate device fabricated during processing of an integrated circuit (IC), or a portion thereof, that may include static random-access memory (SRAM) and/or other logic circuits, passive components such as resistors, capacitors, and inductors, and active components such as p-type FETs (PFETs), n-type FETs (NFETs), fin-like FETs (FinFETs), metal-oxide semiconductor field effect transistors (MOSFET), complementary metal-oxide semiconductor (CMOS) transistors, bipolar transistors, high voltage transistors, high frequency transistors, and/or other memory cells. Device 200 can be a portion of a core region (often referred to as a logic region), a memory region (such as a static random access memory (SRAM) region), an analog region, a peripheral region (often referred to as an input/output (I/O) region), a dummy region, other suitable region, or combinations thereof, of an IC. In some embodiments, device 200 may be a portion of an IC chip, a system on chip (SoC), or portion thereof. The present disclosure is not limited to any particular number of devices or device regions, or to any particular device configurations. For example, though device 200 as illustrated is a three-dimensional FET device (e.g., a FinFET), the present disclosure may also provide embodiments for fabricating planar FET devices. FIGS. 2, 3A-14A, 3B-14B, 3C-14C, 3D-14D, 15A-15P, and 16 have been simplified for the sake of clarity to better understand the inventive concepts of the present disclosure. Additional features can be added in device 200, and some of the features described below can be replaced, modified, or eliminated in other embodiments of device 200.

Referring to FIGS. 1 and 2, at operation 102, method 100 provides device 200, which includes one or more fins 206 protruding from a substrate 202 and separated by an isolation structure 204, and one or more gate structures 210 disposed over substrate 202 and fins 206. Gate structures 210 define a channel region, a source region and a drain region of fins 206. Gate structures 210 may include gate electrodes 212 and gate spacers 214 disposed on sidewalls of gate electrodes 212. Gate structures 210 may include other components such as one or more gate dielectric layers 216 disposed over isolation structure 204 and substrate 202 and below electrodes 212, a barrier layers, a glue layer, a capping layer, other suitable layers, or combinations thereof. Various gate hard mask layers 220 are disposed over gate electrode layer 212 and may be considered a part of the gate structures 210. Device 200 also includes S/D features 250 epitaxially grown over S/D regions of fins 206. It is understood components included in device 200 are not limited to the numbers and configurations as shown in FIG. 2. More or less components, for example, more fins and gate structures, may be included in device 200, as shown in FIGS. 3A-14A, 3B-14B, 3C-14C, and 3D-14D.

In the depicted embodiment of FIG. 2, device 200 includes substrate 202. In the depicted embodiment, substrate 202 is a bulk substrate that includes silicon. Alternatively or additionally, the bulk substrate includes another elementary semiconductor, such as germanium; a compound semiconductor, such as silicon carbide, silicon phosphide, gallium arsenide, gallium phosphide, indium phosphide, indium arsenide, indium antimonide, zinc oxide, zinc selenide, zinc sulfide, zinc telluride, cadmium selenide, cadmium sulfide, and/or cadmium telluride; an alloy semiconductor, such as SiGe, SiPC, GaAsP, AlInAs, AlGaAs, GaInAs, GaInP, and/or GaInAsP; other group III-V materials; other group II-IV materials; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 may include various doped regions. In some examples, substrate 202 includes n-type doped regions (for example, n-type wells) doped with n-type dopants, such as phosphorus (for example, $^{31}$P), arsenic, other n-type dopant, or combinations thereof. In the depicted implementation, substrate 202 includes p-type doped region (for example, p-type wells) doped with p-type dopants, such as boron (for example, $^{11}$B, $BF_2$), indium, other p-type dopant, or combinations thereof. In some embodiments, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

Device 200 also includes an isolation structure 204 disposed over substrate 202. Isolation structure 204 electrically isolates active device regions and/or passive device regions of device 200. Isolation structure 204 can be configured as different structures, such as a shallow trench isolation (STI) structure, a deep trench isolation (DTI) structure, a local oxidation of silicon (LOCOS) structure, or combinations thereof. Isolation structure 204 includes an isolation material, such as silicon oxide, silicon nitride, silicon oxynitride, other suitable isolation material (for example, including silicon, oxygen, nitrogen, carbon, and/or other suitable isolation constituent), or combinations thereof.

Device 200 further includes semiconductor fins 206 protruding from substrate 202 and the lower portions of semiconductor fins 206 are separated by isolation structure 204. Each semiconductor fin 206 may be suitable for providing an n-type FET or a p-type FET. In some embodiments, fins 206 as illustrated herein may be suitable for providing FETs of the same type, i.e., n-type or p-type. Alternatively, they may be suitable for providing FETs of opposite types, i.e., n-type and p-type. Fins 206 are oriented substantially parallel to one another. Each of fins 206 has at least one channel region and at least one source region and at least one drain region defined along their length in the x-direction, where the at least one channel region is covered by gate structures 210 and is disposed between the source region and the drain region. In some embodiments, fins 206 are a portion of substrate 202 (such as a portion of a material layer of substrate 202). For example, in the depicted embodiment, where substrate 202 includes silicon, fins 206 include silicon. Alternatively, in some embodiments, fins 206 are defined in a material layer, such as one or more semiconductor material layers, overlying substrate 202. For example, fins 206 can include a semiconductor layer stack having various semiconductor layers (such as a heterostructure) disposed over substrate 202. The semiconductor layers can include any suitable semiconductor materials, such as silicon, germanium, silicon germanium, other suitable semiconductor materials, or combinations thereof. The semiconductor layers can include same or different materials, etching rates, constituent atomic percentages, constituent weight percentages, thicknesses, and/or configurations depending on design requirements of device 200.

Fins 206 are formed by any suitable process including various deposition, photolithography, and/or etching processes. An exemplary photolithography process includes forming a photoresist layer (resist) overlying substrate 202 (e.g., on a silicon layer), exposing the resist to a pattern, performing a post-exposure bake process, and developing the resist to form a masking element including the resist. The masking element is then used to etch the fin structure into substrate 202. Areas not protected by the masking element are etched using reactive ion etching (RIE) processes and/or other suitable processes. In some embodiments, fins 206 are formed by patterning and etching a portion of silicon substrate 202. In some other embodiments, fins 206 are formed by patterning and etching a silicon layer deposited overlying an insulator layer (for example, an upper silicon layer of a silicon-insulator-silicon stack of an SOI substrate). As an alternative to traditional photolithography, fins 206 can be formed by a double-patterning lithography (DPL) process. DPL is a method of constructing a pattern on a substrate by dividing the pattern into two interleaved patterns. DPL allows enhanced feature (e.g., fin) density. Various DPL methodologies include double exposure (e.g., using two mask sets), forming spacers adjacent features and removing the features to provide a pattern of spacers, resist freezing, and/or other suitable processes. It is understood that multiple parallel fins 206 may be formed in a similar manner.

In the depicted embodiment of FIG. 2, various gate structures 210 are formed over fins 206. Gate structures 210 extend along y-direction and traverse fins 206. Gate structures 210 engage the respective channel regions of fins 206, such that current can flow between the respective S/D regions of fins 206 during operation. Each gate structure 210 may include a gate dielectric layer 216 and a gate electrode 212. Gate dielectric layer 216 may include a high-k dielectric material, which is a material having a dielectric constant that is greater than a dielectric constant of $SiO_2$, which is approximately 3.9. In some embodiments, the high-k gate dielectric includes hafnium oxide (HfO2), which has a dielectric constant that is in a range from approximately 18 to approximately 40. In alternative embodiments, the high-k gate dielectric may include ZrO2, $Y_2O_3$, La2O5, Gd2O5, TiO2, Ta2O5, HfErO, HfLaO, HfYO, HfGdO, HfAlO, HfZrO, HfTiO, HfTaO, or SrTiO. Gate electrode 212 may include a metal-containing material. In some embodiments, the metal gate electrode may include a work function metal component and a fill metal component. The work functional metal component is configured to tune a work function of its corresponding FinFET to achieve a desired threshold voltage Vt. In various embodiments, the work function metal component may contain: TiAl, TiAlN, TaCN, TiN, WN, or W, or combinations thereof. The fill metal component is configured to serve as the main conductive portion of the functional gate structure. In various embodiments, the fill metal component may contain Aluminum (Al), Tungsten (W), Copper (Cu), or combinations thereof.

A gate hard mask layer 220 is formed over gate electrode layer 212 and is considered a part of gate structure 210. Gate hard mask layer 220 includes any suitable material, for example, SiN, SiC, LaO, AlO, AlON, ZrO, HfO, Si, ZnO, ZrN, ZrAlO, TiO, TaO, YO, TaCN, ZrSi, SiOCN, SiOC, SiCN, HfSi, LaO, SiO, spin-on glass (SOG), a low-k film, tetraethylorthosilicate (TEOS), plasma enhanced CVD oxide (PE-oxide), high-aspect-ratio-process (HARP) formed oxide, other suitable material, or combinations thereof. Gate hard mask layer 220 is formed over gate electrode layer 212 by any suitable process. For example, a deposition process may be performed to form gate hard mask layer 220 over substrate 202, fins 206, and isolation structure 204. The deposition process includes CVD, PVD, ALD, HDPCVD, MOCVD, RPCVD, PECVD, LPCVD, ALCVD, APCVD, plating, other suitable methods, or combinations thereof.

Spacers 214 are located along the sidewalls of gate structures 210. Spacers 214 may include various layers, for example, one or more dielectric layers and pattern layers. In some embodiments, a dielectric layer is formed conformally over substrate 202, including fins 206 and dummy gate structures. A pattern layer is formed conformally over the dielectric layer. Dielectric layer may include any suitable dielectric material, such as silicon, oxygen, carbon, nitrogen, other suitable material, or combinations thereof (for example, silicon oxide, silicon nitride, silicon oxynitride, or silicon carbide, and may be formed by any suitable method, such as ALD, CVD, PVD, other suitable methods, or combinations thereof. The pattern layer may include any suitable material that has a different etch rate than the dielectric layer 220, such as silicon nitride, silicon carboxynitride, other suitable dielectric materials, or combinations thereof. The pattern layer is deposited by any suitable method, such as ALD, to any suitable thickness. Subsequently, top portions of the dielectric layer and the pattern layers, as well as top portions of dummy gate structures are removed by a suitable etching process or any other suitable process. The suitable etching process, such as a dry etching process, a wet etching process, a reactive ion etching (RIE) process, or combinations thereof. The remaining portions of dielectric layer and pattern layer along dummy gate structures form gate spacers 214.

In some embodiments, gate structures 210 are formed by a gate replacement process after other components (for example, epitaxial S/D features 250 and first ILD layer 270) of device 200 are fabricated. In a gate replacement process, dummy gate structures are formed to wrap the channel regions of respective fins 206. Each dummy gate structure may include a dummy gate electrode comprising polysilicon (or poly) and various other layers, for example, a hard mask layer disposed over dummy gate electrode, and an interfacial layer disposed over fins 206 and substrate 202, and below dummy gate electrode. After the formation of epitaxial S/D features 250 as well as first ILD layer 270, dummy gate structures are removed using one or more etching processes (such as wet etching, dry etching, RIE, or other etching techniques), therefore leaving openings over the channel regions of fins 206 in place of the removed dummy gate structures. The opening is then filled with a high-K dielectric material to form dielectric layer 216 by various processes, such as ALD, CVD, PVD, and/or other suitable process. A metal gate material is then deposited over the dielectric material to form the metal gate electrodes 212 of gate structures 210. Gate electrodes 212 are formed by various deposition processes, such as ALD, CVD, PVD, and/or other suitable process. Gate hard mask layer 220 is then formed over gate electrode 212 by any suitable deposition process as those aforementioned. A CMP process can be performed to remove any excess material of gate dielectric layer 216, gate electrodes 212, and/or gate hard mask layer 220 to planarize gate structures 210.

Device 200 also includes epitaxial S/D features 250 formed in the source/drain regions of fins 206. For example, semiconductor material is epitaxially grown on fins 206, forming epitaxial S/D features 250 on fins 206. In some embodiments, a fin recess process (for example, an etch back process) is performed on source/drain regions of fins 206, such that epitaxial source/drain features 250 are grown from lower fin active regions. In some other embodiments, source/drain regions of fins 206 are not subjected to a fin recess process, such that epitaxial source/drain features 250 are grown from and wrap at least a portion of upper fin active regions. In furtherance of some embodiments, epitaxial source/drain features 250 extend (grow) laterally along the y-direction, such that epitaxial source/drain features 250 are merged epitaxial source/drain features that span more than one fin. In some embodiments, epitaxial source/drain features 250 include partially merged portions and/or fully merged portions.

An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of fins 206. In some embodiments, epitaxial source/drain features 250 are doped with n-type dopants and/or p-type dopants depending on a type of FinFET fabricated in their respective FinFET device region. For example, in p-type FinFET region, epitaxial source/drain features 250 can include epitaxial layers including silicon and/or germanium, where the silicon germanium containing epitaxial layers are doped with boron, carbon, other p-type dopant, or combinations thereof (for example, forming an Si:Ge:B epitaxial layer or an Si:Ge:C epitaxial layer). In furtherance of the example, in n-type FinFET region, epitaxial source/drain features 250 can include epitaxial layers including silicon and/or carbon, where silicon-containing epitaxial layers or silicon-carbon-containing epitaxial layers are doped with phosphorous, arsenic, other n-type dopant, or combinations thereof (for example, forming an Si:P epitaxial layer, an Si:C epitaxial layer, or an Si:C:P epitaxial layer). In some embodiments, epitaxial source/drain features 250 include materials and/or dopants that achieve desired tensile stress and/or compressive stress in the channel regions. In some embodiments, epitaxial source/drain features 250 are doped during deposition by adding impurities to a source material of the epitaxy process. In some embodiments, epitaxial source/drain features 250 are doped by an ion implantation process subsequent to a deposition process. In some embodiments, annealing processes are performed to diffuse dopants in epitaxial source/drain features 250 of device 200.

Still referring to FIGS. 1, 2, and 3A-3D, at operation 104, a first interlayer dielectric (ILD) layer 270 is formed over substrate 202. First ILD layer 270 include a material that is different than a material of gate hard mask layers 220 and spacers 214 to achieve etching selectivity during subsequent etching processes. First ILD layer 270 includes a dielectric material that includes oxygen. For example, first ILD layer 270 includes an oxide layer. In some embodiments, first ILD layer 270 includes SiO, SiON, TEOS formed oxide, PSG, BPSG, low-k dielectric material (K<3.9), other suitable dielectric material, or combinations thereof. Exemplary low-k dielectric materials include FSG, carbon doped silicon oxide, Black Diamond® (Applied Materials of Santa Clara, Calif.), Xerogel, Aerogel, Parylene, BCB, SiLK (Dow Chemical, Midland, Mich.), polyimide, other low-k dielectric material, or combinations thereof. First ILD layer 270 may include a multi-layer structure having multiple dielectric materials and may be formed by a deposition process such as CVD, flowable CVD (FCVD), spin-on-glass (SOG), other suitable methods, or combinations thereof. In some embodiments, an etch stop layer (ESL) may be formed between substrate 202 and First ILD layer 270. In some embodiments, ESL 280 includes a dielectric material, such as a material that includes silicon and nitrogen (for example, SiN or SiON). The ESL may be formed by a deposition process (such as CVD, FCVD, PVD, ALD, HDPCVD, MOCVD, RPCVD, PECVD, LPCVD, ALCVD, APCVD, plating, other suitable methods, or combinations thereof). Subsequent to the deposition of the ESL and/or first ILD layer 270, a CMP process and/or other planarization process is performed to planarize the top surface of device 200.

Still referring to FIGS. 1, 2, and 3A-3D, at operation 104, S/D contacts 260 are disposed over the S/D regions of fins 206. S/D contacts 260 are portions of a multilayer interconnect (MLI) feature that electrically couples various devices (for example, transistors, resistors, capacitors, and/or inductors) and/or components (for example, gate structures and/or source/drain features) of device 200, such that the various devices and/or components can operate as specified by design requirements of device 200. S/D contacts 260 may include any suitable electrically conductive material, such as Ta, Ti, Al, Cu, Co, W, TiN, TaN, other suitable conductive materials, or combinations thereof. Various conductive materials can be combined to provide S/D contacts 260 with various layers, such as one or more barrier layers, adhesion layers, liner layers, bulk layers, other suitable layers, or combinations thereof. S/D contacts 260 are formed by patterning first ILD layer 270. Patterning first ILD layer 270 can include lithography processes and/or etching processes to form openings (trenches) in first ILD layer 270. In some embodiments, the lithography processes include forming a resist layer over first ILD layer 270, exposing the resist layer to patterned radiation, and developing the exposed resist layer, thereby forming a patterned resist layer that can be used as a masking element for etching opening(s) in first ILD layer 270. The etching processes include dry etching processes, wet etching processes, other etching processes, or combinations thereof. Thereafter, the contact opening(s) are filled with one or more conductive materials. The conductive material(s) can be deposited by PVD, CVD, ALD, electroplating, electroless plating, other suitable deposition process, or combinations thereof. Thereafter, any excess conductive material(s) can be removed by a planarization process, such as a CMP process, thereby planarizing a top surface of first ILD layer 270 and S/D contacts 260.

Figure 3A:
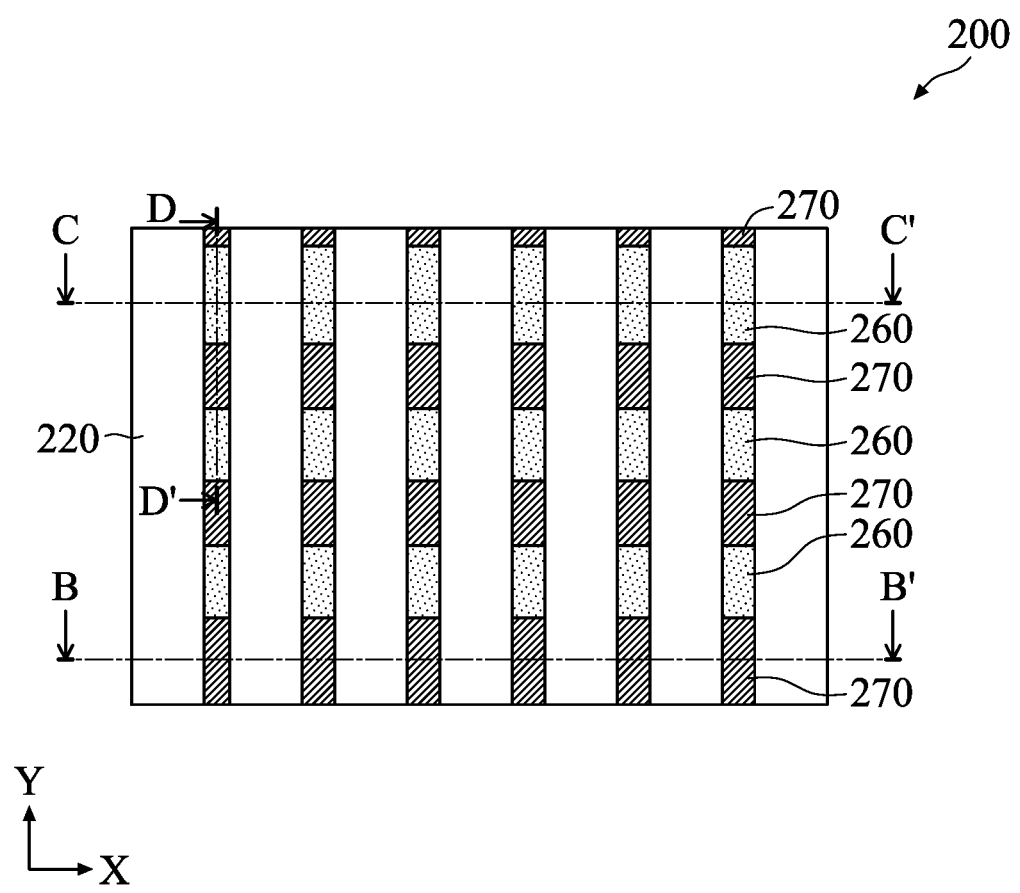
Figure 3B:
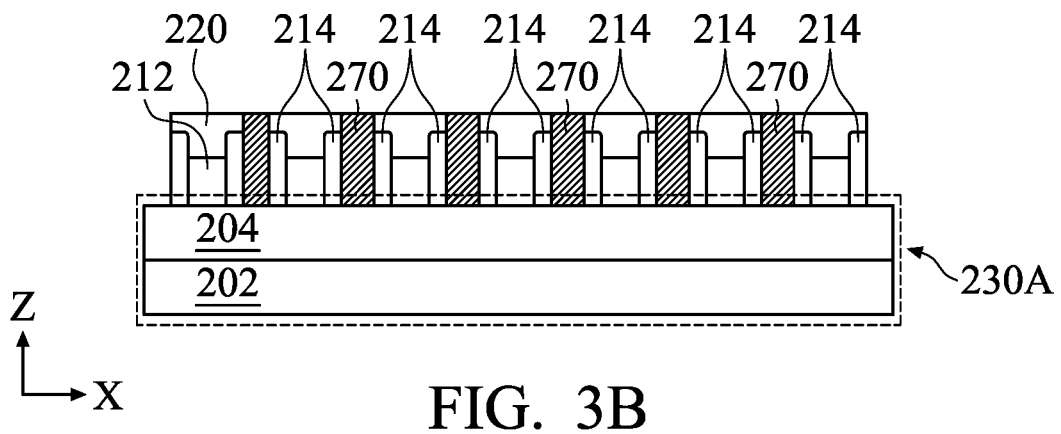
Figure 3C:
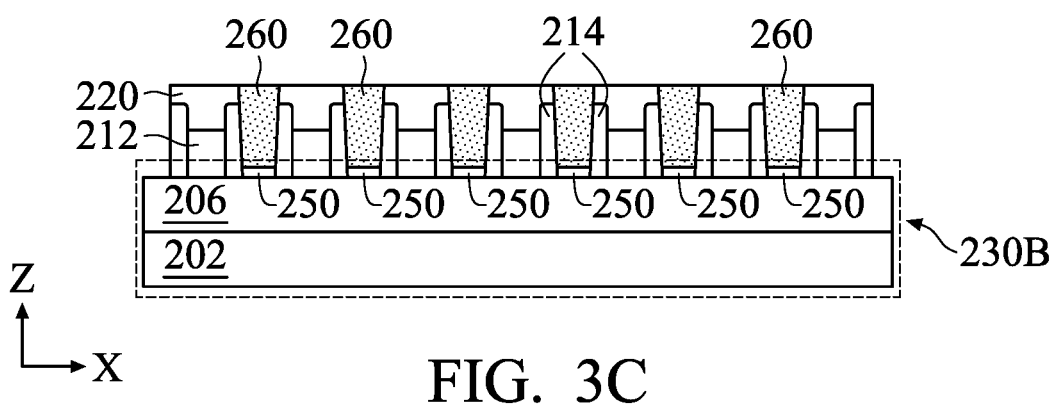
Figure 3D:
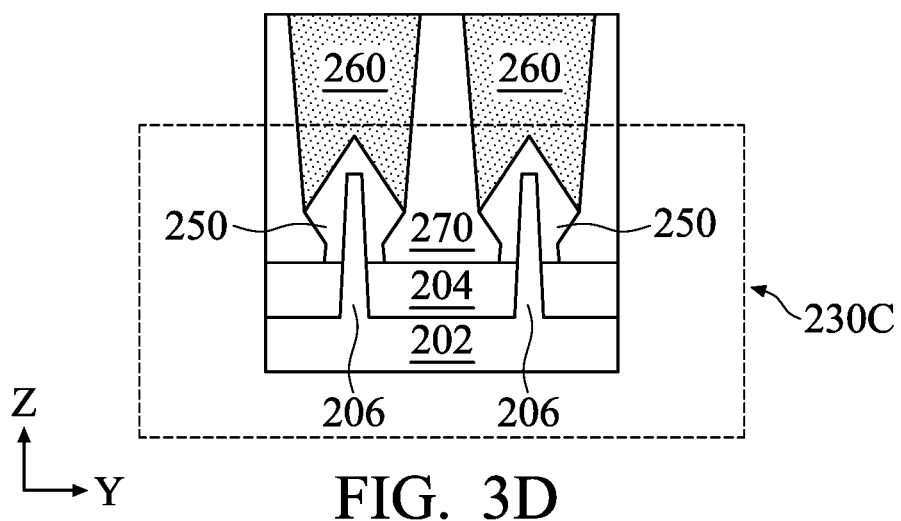
Figure 4A:
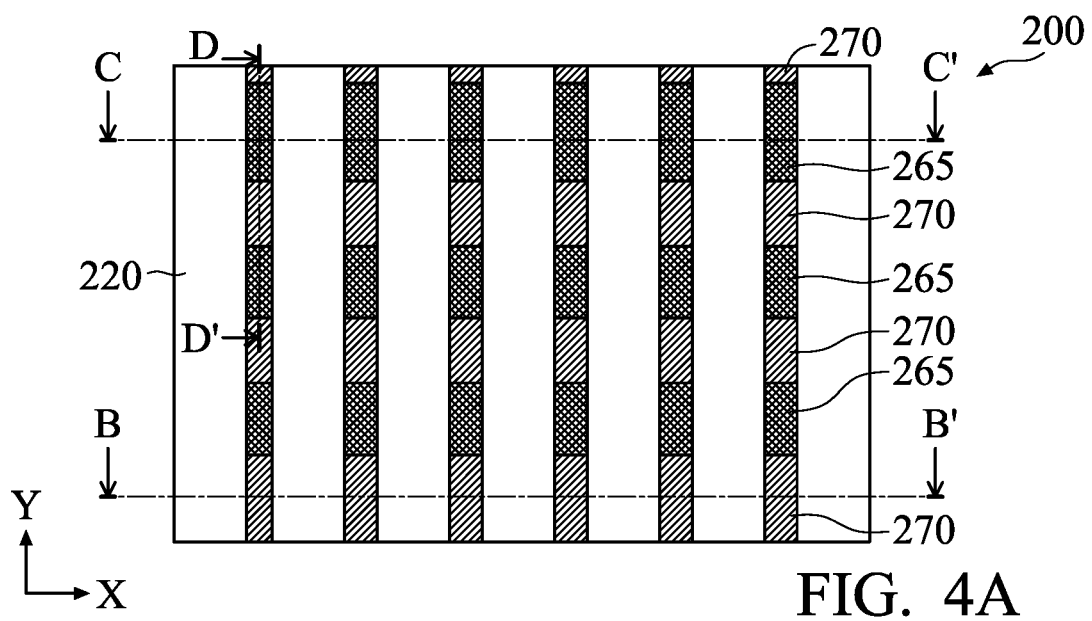
Figure 4B:
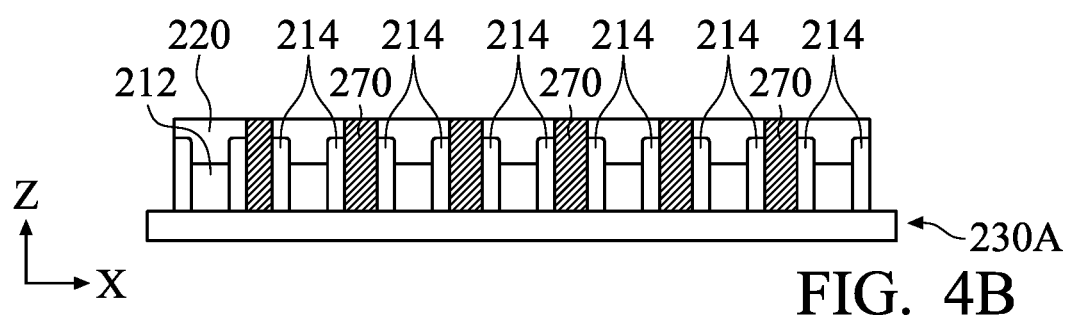
Figure 4C:
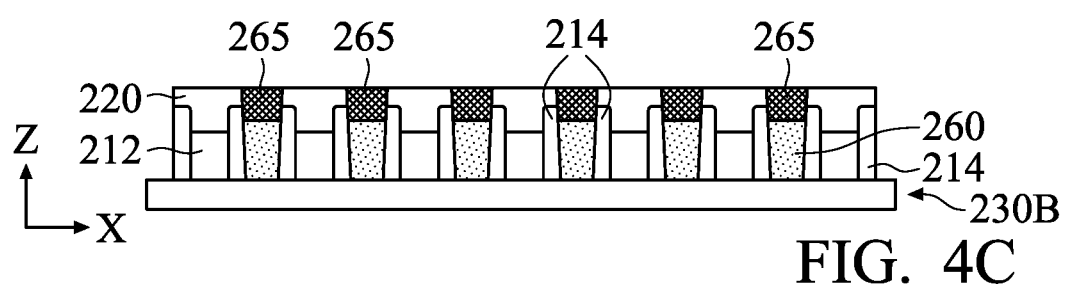
Figure 4D:
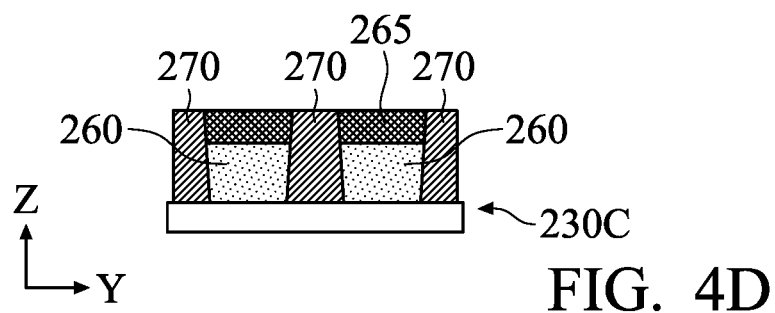

In the depicted embodiment, referring to FIG. 3D, S/D contacts 260 have a shape of reverse trapezoid in the y-z plane, that is a length along the y-direction of the top surface of S/D contacts 260 is greater than a length along the y-direction of the bottom surface of S/D contacts 260. Accordingly, patterned first ILD layer 270 has a shape of trapezoid in the y-z plane, that is a length along the y-direction of the top surface of first ILD layer 270 is less than a length along the y-direction of the bottom surface of first ILD layer 270. In some other embodiments, S/D contacts 260 and first ILD layer 270 have other shape(s) in the y-z plane. Shown in FIG. 3D, adjacent fins 206, along with respective S/D contacts 260 and epitaxial S/D features 250, are isolated from each other by first ILD layer 270.

FIGS. 3B-3D show bottom layers 230A, 230B, and 230C of device 200 for illustration purposes only. Bottom layers 230A, 230B, and 230C may be cropped from, not shown, or otherwise removed from FIGS. 4A-16 for simplicity. Bottom layers 230 show different layers in different views. For example, in FIG. 3B, bottom layer 230A includes isolation structure 204 and substrate 202; in FIG. 3C, bottom layer 230B includes epitaxial S/D features 250, fins 206 and substrate 202; and in FIG. 3D, bottom layer 230C includes portions of first ILD layer 270, epitaxial S/D features 250, fins 206, isolation structure 204, and substrate 202. Bottom layers 230A, 230B, and 230C may include other possible layers, or combinations thereof.

Now referring to FIGS. 1 and 4A-4D, at operation 106, source/drain (S/D) hard mask layers 265 are formed over S/D contacts 260. Source/drain hard mask layers 265 include a material that is different than a material of first ILD layer 270 and gate hard mask layers 220 to achieve etching selectivity during subsequent etching processes. S/D hard mask layers 265 include any suitable material, for example, SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, LaO, SiO, other suitable material, or combinations thereof. S/D hard mask layers 265 are formed over S/D contacts 260 by any suitable process. In an exemplary process, S/D contacts 260 are recessed by a selective etching process that etches S/D contacts 260 without (or minimally) etching first ILD layer 270 and gate hard mask layers 220, thereby forming recesses having sidewalls defined by first ILD layer 270 and gate hard mask layers 220 and bottoms defined by top surfaces of etched back S/D contacts 260. After the selective etching, top surfaces of S/D contacts 260 are lower than a top surface of first ILD layer 270 and top surfaces of gate hard mask layers 220. A deposition process may then form a S/D hard mask layer over first ILD layer 270, gate hard mask layers 220, and S/D contacts 260, where the S/D hard mask layer fills recesses formed by the selective etching process. A CMP process may then remove excess S/D hard mask layer, such as the S/D hard mask layer disposed over first ILD layer 270 and gate hard mask layers 220, thereby forming S/D hard mask layers 265 and exposing the top surface of first ILD layer 270 and the top surfaces of gate hard mask layers 220. The deposition process for the S/D hard mask layer may include CVD, PVD, ALD, HDPCVD, MOCVD, RPCVD, PECVD, LPCVD, ALCVD, APCVD, plating, other suitable methods, or combinations thereof.

Figure 5A:
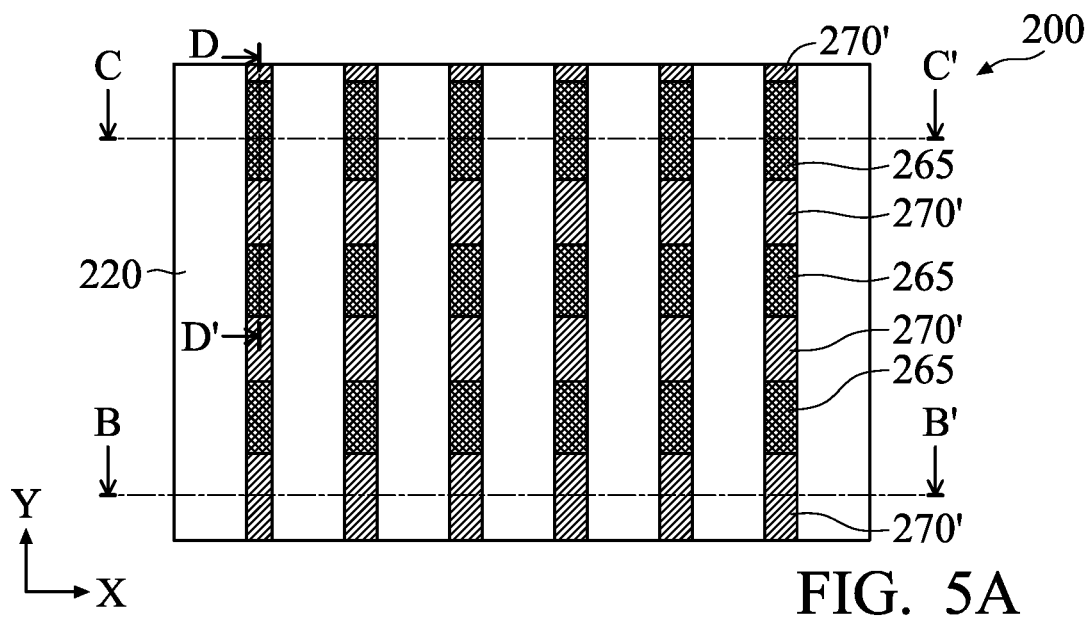
Figure 5B:
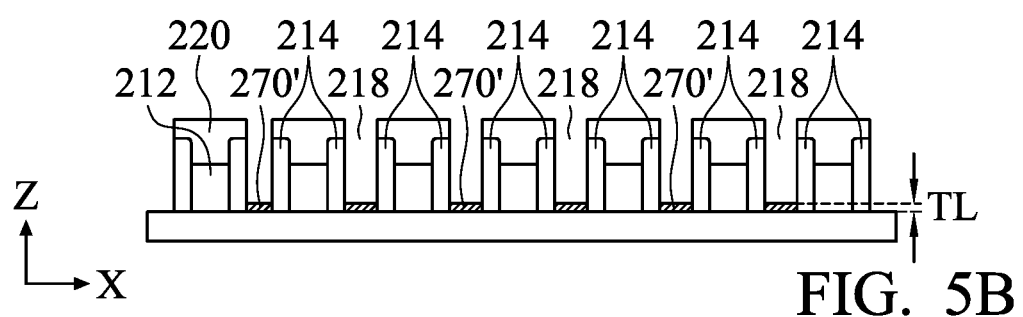
Figure 5C:
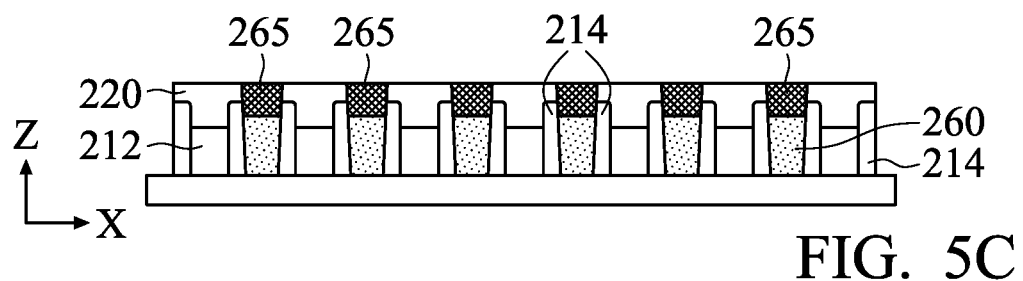
Figure 5D:
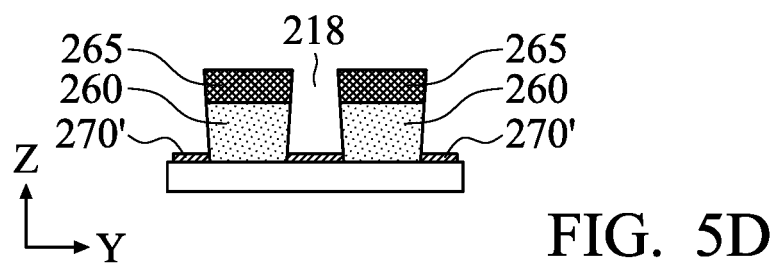
Figure 12A:
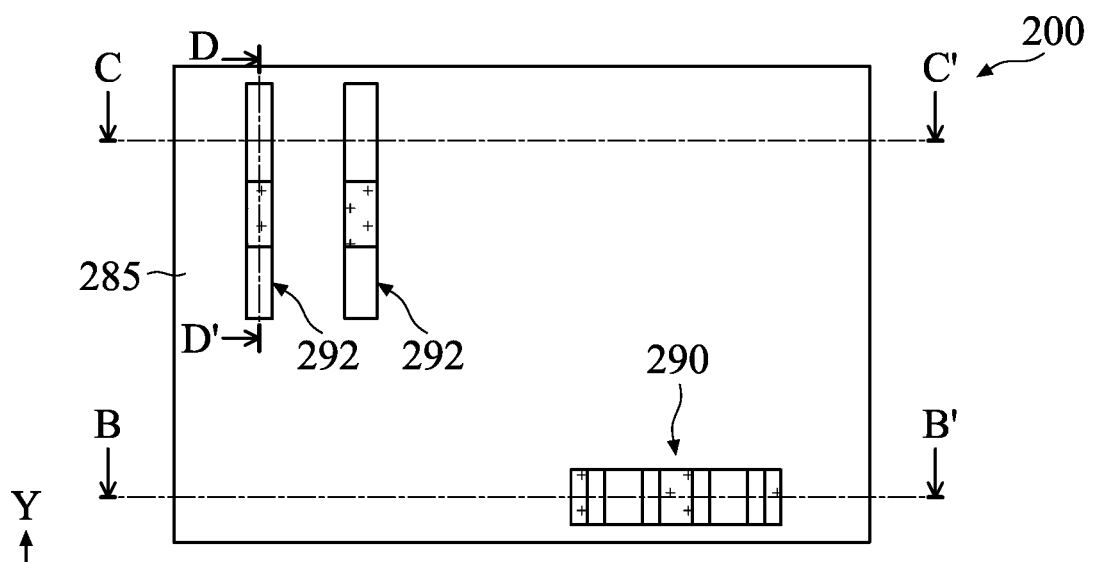
Figure 12B:
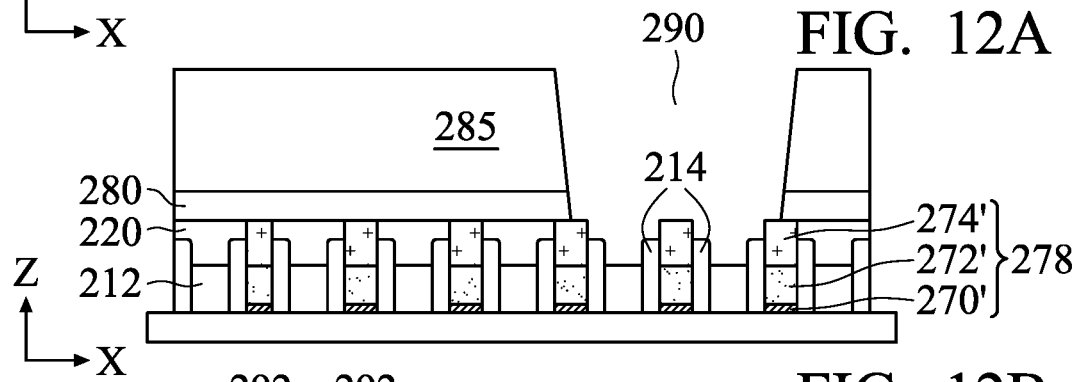
Figure 12C:
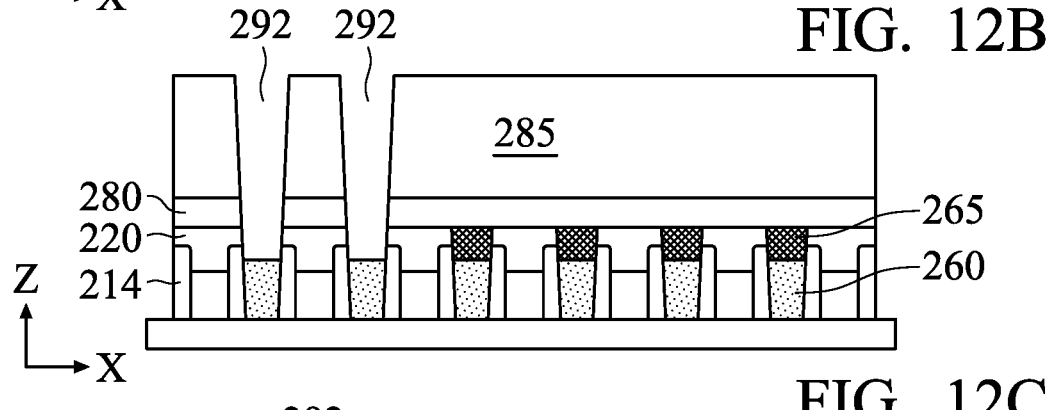

Now referring to FIGS. 1 and 5A-5D, at operation 108, first ILD layer 270 is recessed to form openings (trenches) 218. Openings 218 have sidewalls defined by gate spacers 214 of adjacent gate structures 210, gate hard mask layers 220, and adjacent S/D contact structures (here, S/D contacts 260 having S/D hard mask layers 265 disposed thereover). Openings 218 have bottoms defined by the remaining first ILD layer 270. In FIG. 5D, openings 218 have a shape of a trapezoid in the y-z plane, i.e. lengths of tops of openings 218 along the y-direction are shorter than lengths of bottoms of openings 218 along the y-direction. Recessing first ILD layer 270 can include lithography processes and/or etching processes. In some embodiments, the lithography processes include forming a resist layer over first ILD layer 270, exposing the resist layer to patterned radiation, and developing the exposed resist layer, thereby forming a patterned resist layer that can be used as a masking element for etching first ILD layer 270 to form openings 218. The etching processes include dry etching processes, wet etching processes, other etching processes, or combinations thereof. In the present example, a selective etching process etches a top portion of first ILD layer 270 without (or minimally) etching spacers 214 and gate hard mask layers 220. In some implementations, an anisotropic etching process is performed to remove the top portion of first ILD layer 270. A remaining (bottom) portion of first ILD layer 270 is referred to as ILD Lower (ILD_L) layer 270'. ILD_L layer 270' forms the lower layer of a tri-layer ILD layer 278 as shown in FIG. 12B. A top surface of ILD_L layer 270' is below top surfaces of spacers 214, top surfaces of gate hard mask layers 220, and top surfaces of S/D contacts 260. For example, a thickness along the z-direction of ILD_L layer 270', i.e. TL, is about 0.5 nm to about 50 nm.

Now referring to FIG. 1, FIGS. 6A-6D, FIGS. 7A-7D, and FIGS. 8A-8D, at operation 110, a second ILD layer 272 is processed to form an ILD Middle (ILD_M) layer 272' over ILD_L layer 270'. ILD_M layer 272' forms the middle layer of tri-layer ILD layer 278 as shown in FIG. 12B. Turning to FIGS. 6A-6D, second ILD layer 272 is deposited over substrate 202. Second ILD layer 272 fills openings 218 and is disposed on ILD_L layer 270'. Second ILD layer 272 may include a material different from gate spacers 214, gate hard mask layer 220, S/D contact 260, and S/D hard mask layer 265 to achieve etching selectivity during subsequent etching processes. In some embodiments, the material of second ILD layer 272 is different from the material of first ILD layer 270, such that the material of second ILD layer 272 may impart ILD_M layer 272' with an improved contact to contact TDDB window between adjacent S/D contacts 260. Second ILD layer 272 includes any suitable material, for example, SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, LaO, SiO, other suitable material, or combinations thereof. Second ILD layer 272 is formed over substrate 202 by a deposition process, such as CVD, PVD, ALD, HDPCVD, MOCVD, RPCVD, PECVD, LPCVD, ALCVD, APCVD, plating, other suitable methods, or combinations thereof.

Figure 6A:
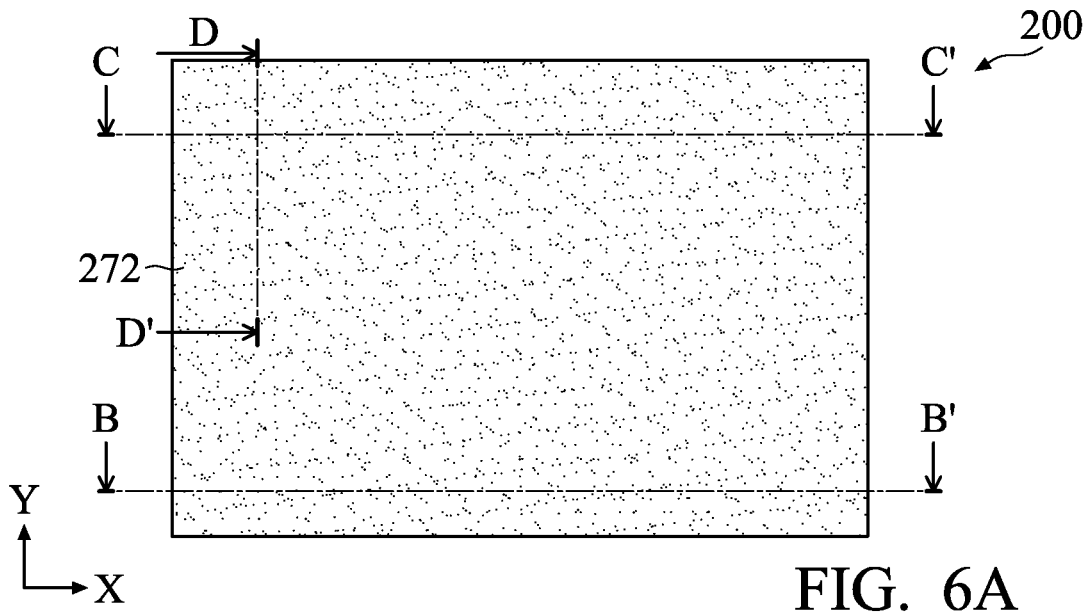
Figure 6B:
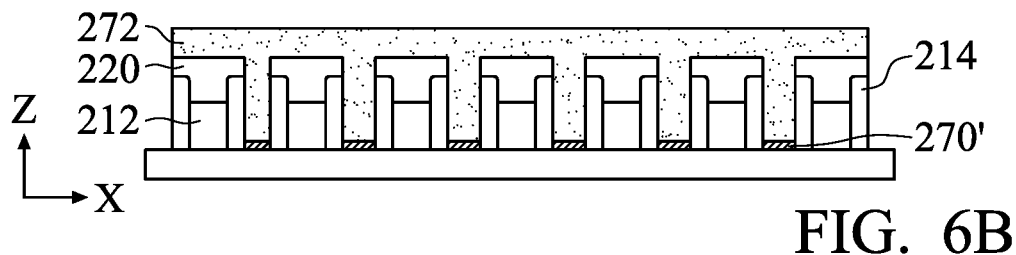
Figure 6C:
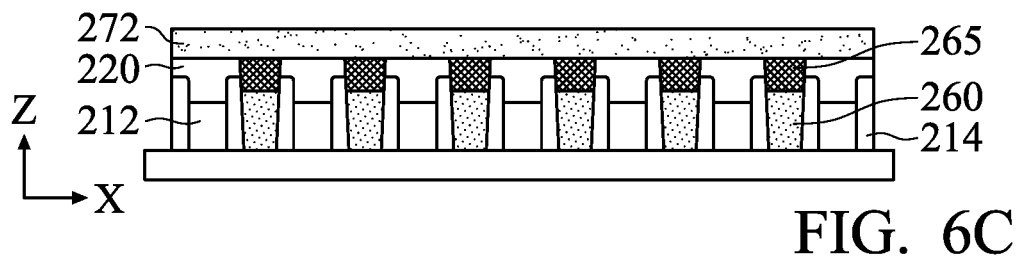
Figure 6D:
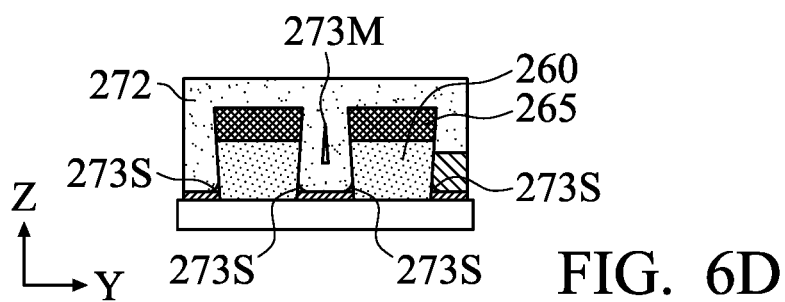
Figure 7A:
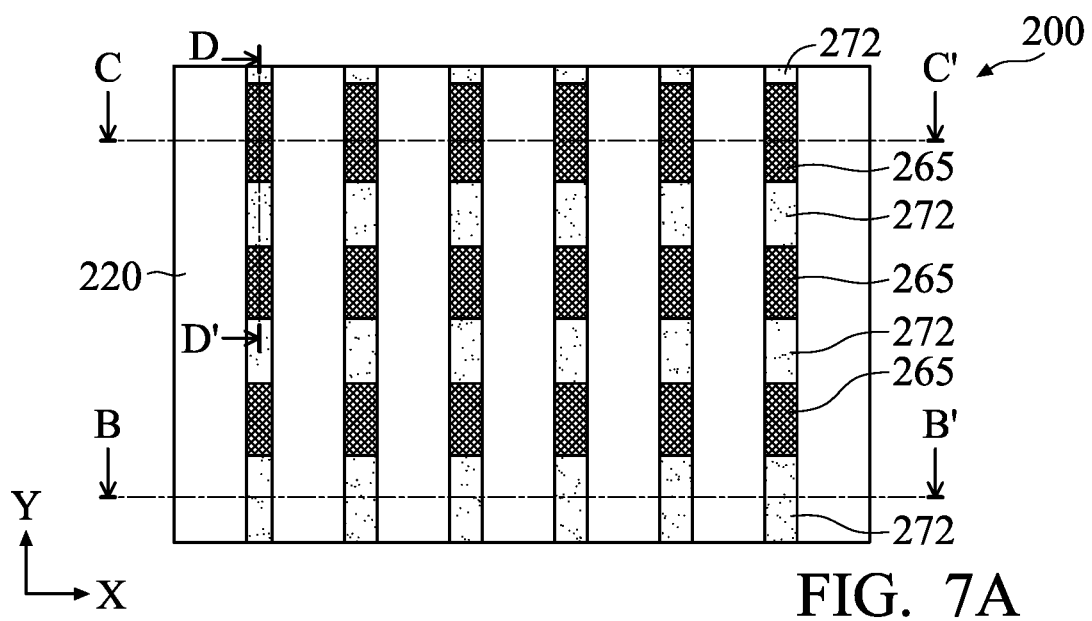
Figure 7B:
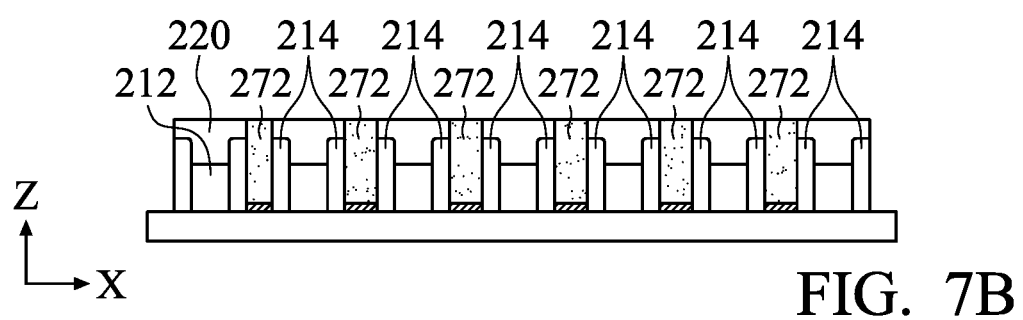
Figure 7C:
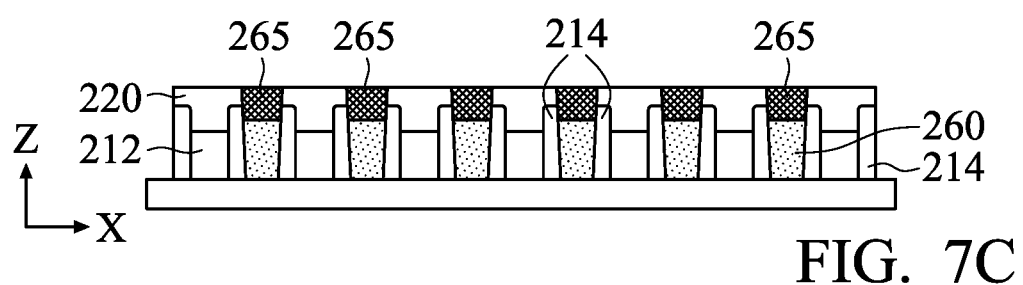
Figure 7D:
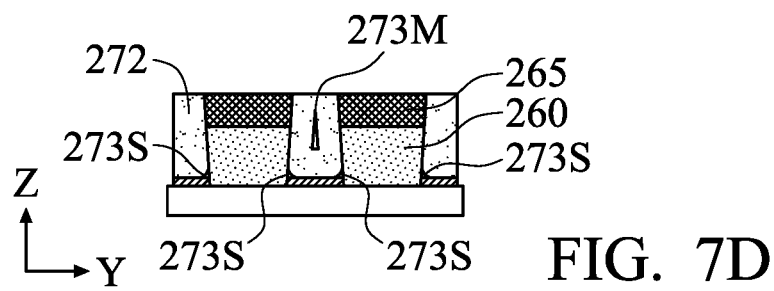
Figure 16:
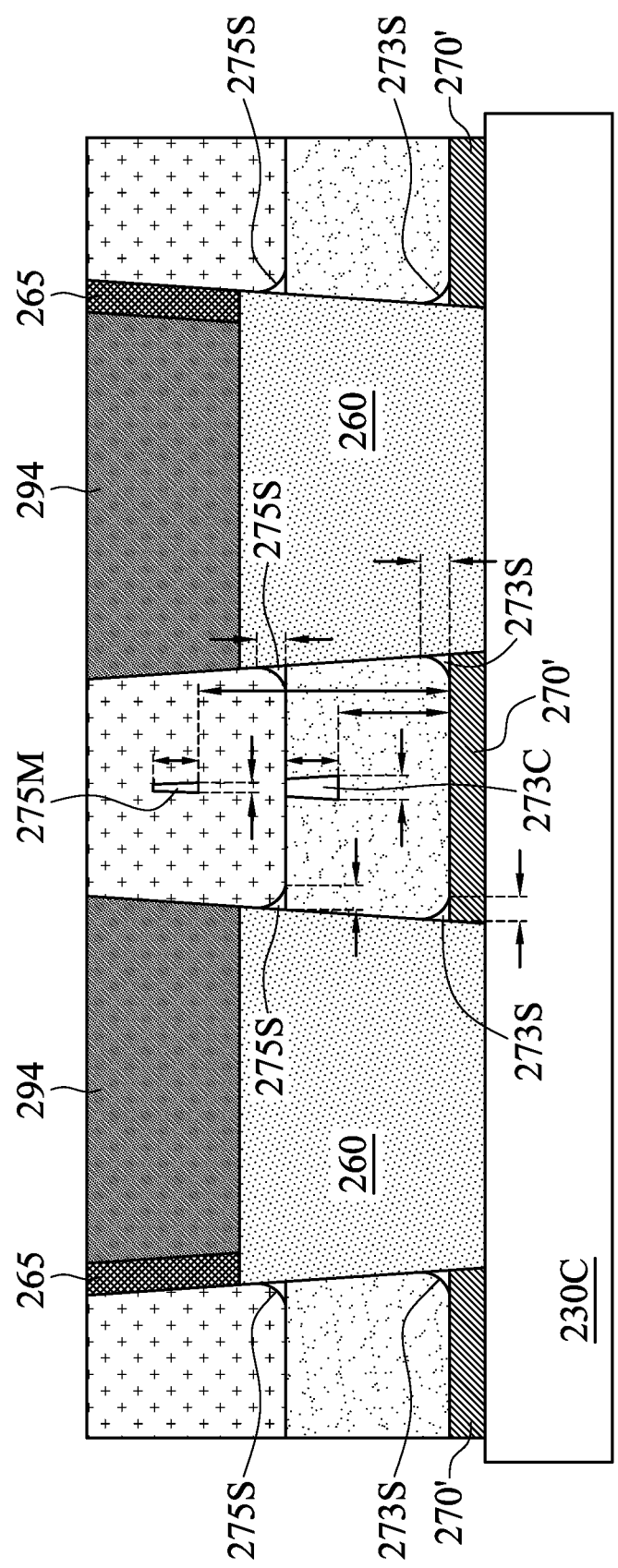
FIG. 16 illustrates the positions and dimensions of voids at a higher magnification.

In some embodiments, referring to FIGS. 6D and 16, one or more central voids 273M and boundary voids 273S may occur during the deposition of second ILD layer 272, particularly when openings 218 have trapezoidal shapes in the y-z plane. In some embodiments, central voids 273M may occur in the middle of opening 218 when filling in the material of second ILD layer 272. Central voids 273M are formed when the middle of openings 218 are not completely filled by second ILD layer 272. In some other embodiments, boundary voids 273S may occur at the bottom side corners of opening 218 when filling in the material of second ILD layer 272. Boundary voids 273S are formed when corners of openings 218 are not completely filled by second ILD layer 272. Boundary voids 273S are defined between S/D contacts 260, ILD_L layers 270', and second ILD layer 272. In yet some other embodiments, central voids 273M and boundary voids 273S may occur in the middle of opening 218 and at the bottom side corners of opening 218, respectively, when filling in the material of second ILD layer 272. Central voids 273M and boundary voids 273S may have a width in the y-direction and a height in the z-direction. The width of central voids 273M and boundary voids 273S is 0 nm to about 30 nm, and the height of central voids 273M and boundary voids 273S is 0 nm to about 30 nm. A distance of a bottom surface of central void 273M to the top surface of ILD_L layer 270' in the z-direction is 0 nm to about 60 nm. A relatively slow deposition process or a high temperature deposition process (for example, a deposition at a temperature of about 150° C. to about 550° C.) may reduce the occurrence of central voids 273M and boundary voids 273S.

Referring to FIGS. 1 and 7A-7D, still at operation 110, any excess material(s) of second ILD layer 272 may be removed by a planarization process, such as a CMP process or an etching process, thereby planarizing a top surface of device 200. In some embodiment, a planarization process is performed to remove excess second ILD layer 272, such as second ILD layer 272 disposed over gate hard mask layers 220 and S/D hard mask layer 265, thereby exposing top surfaces of gate hard mask layers 220 and top surfaces of S/D hard mask layer 265.

Figure 8A:
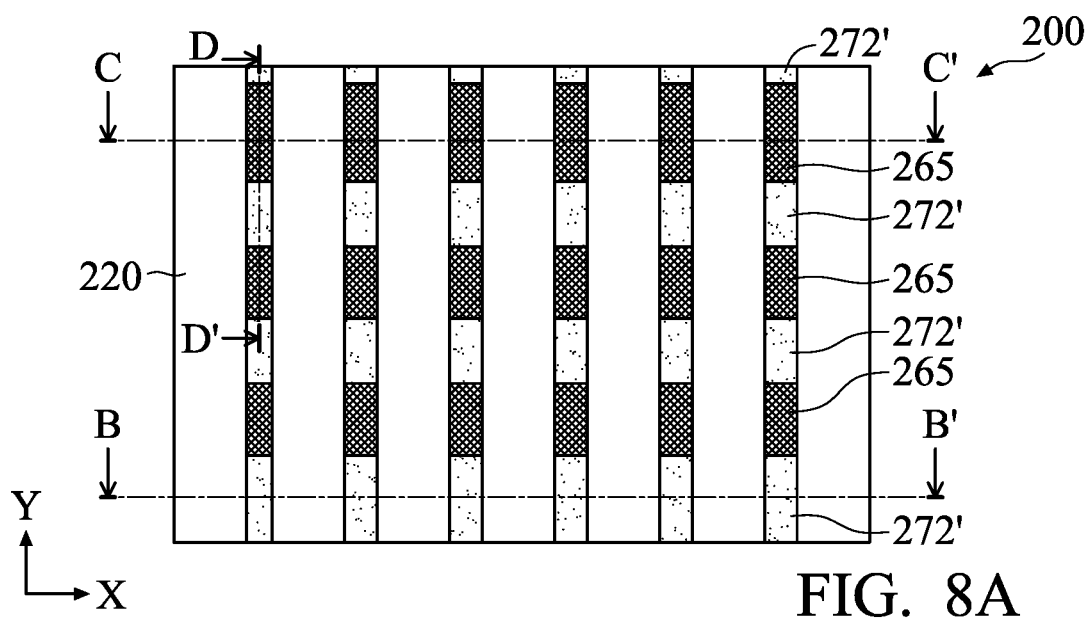
Figure 8B:
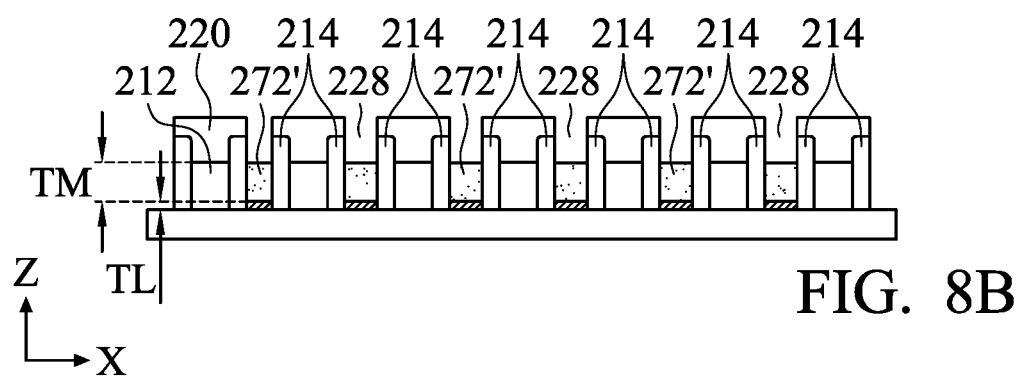
Figure 8C:
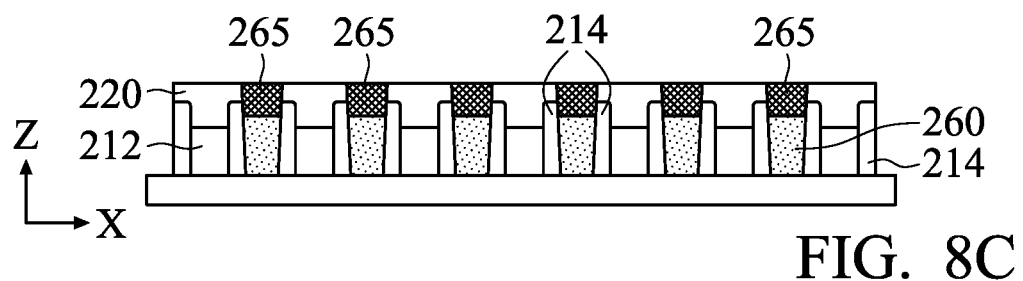
Figure 8D:
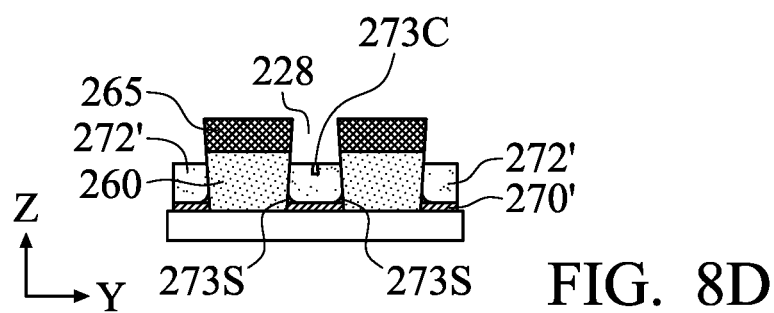
Figure 9A:
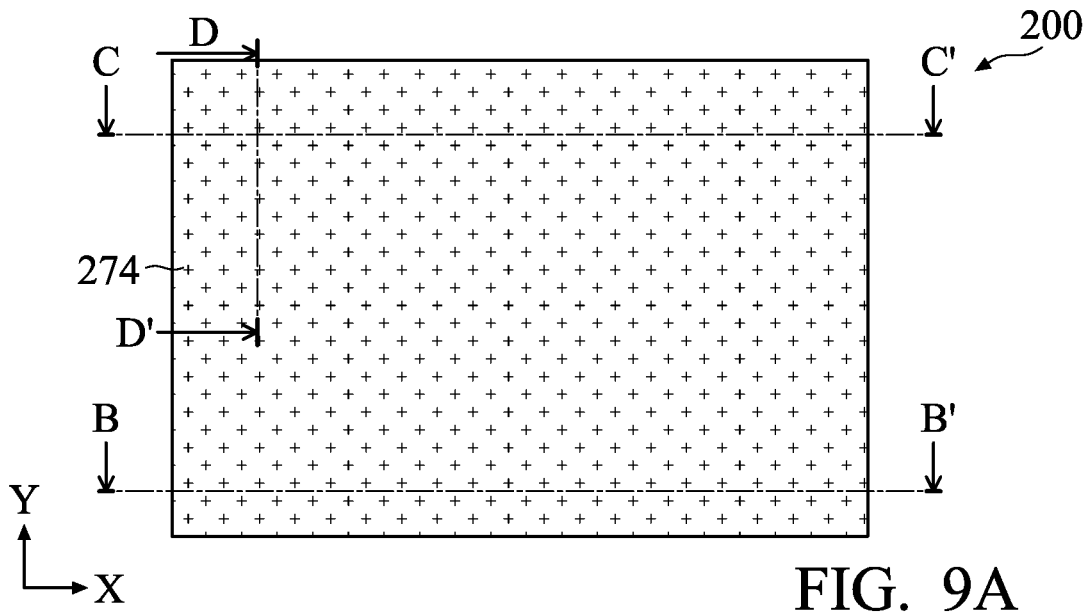
Figure 9B:
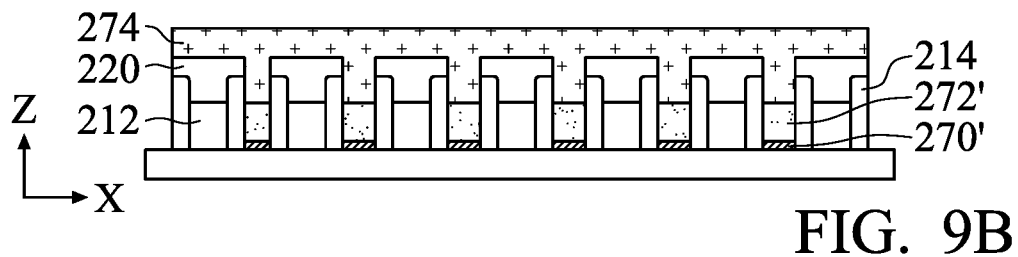
Figure 9C:
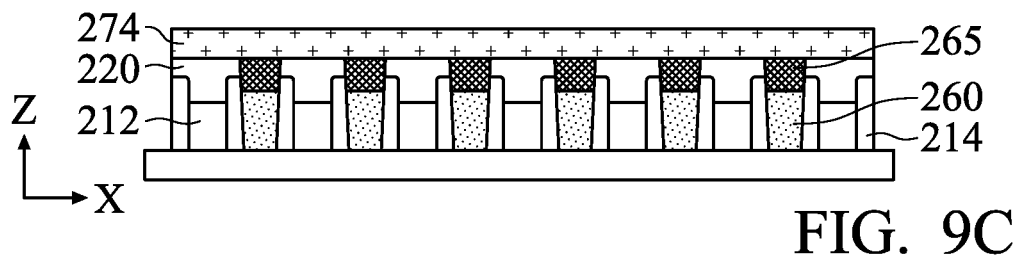
Figure 9D:
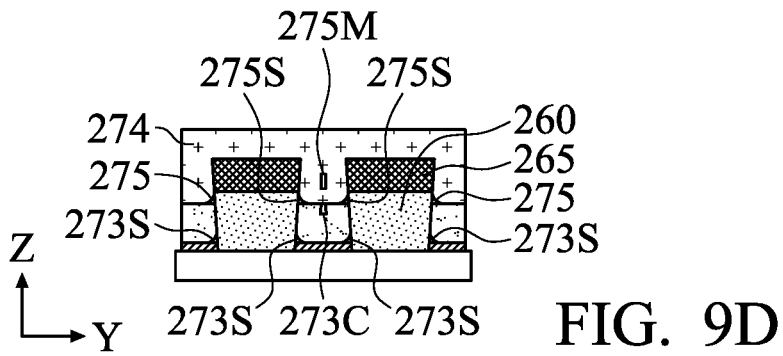

Referring to FIGS. 1 and 8A-8D, still at operation 110, second ILD layer 272 is recessed to form openings (trenches) 228. Openings 228 have sidewalls defined by spacers 214, gate hard mask layers 220 of adjacent gate structures 210, and adjacent S/D contact structures (here, S/D contacts 260 and S/D hard mask features 265 disposed thereover). Bottoms of openings 228 are defined by the recessed second ILD layer 272. In FIG. 8D, openings 228 have a shape of a trapezoid in the y-z plane, i.e. lengths of tops of openings 228 along the y-direction are shorter than lengths of bottoms of openings 228 along the y-direction Recessing second ILD layer 272 can include lithography processes and/or etching processes. In some embodiments, the lithography processes include forming a resist layer over second ILD layer 272, exposing the resist layer to patterned radiation, and developing the exposed resist layer, thereby forming a patterned resist layer that can be used as a masking element for etching second ILD layer 272 to form openings 228. The etching processes include dry etching processes, wet etching processes, other etching processes, or combinations thereof. In the present example, a selective etching process etches a top portion of second ILD layer 272 without (or minimally) etching spacers 214, gate hard mask layers 220, S/D hard mask layers 265, and/or S/D contacts 260. In some implementations, an anisotropic etching process is performed to remove the top portion of second ILD layer 272. A remaining (bottom) portion of second ILD layer 272 is referred to as ILD Middle (ILD_M) layer 272'. A top surface of ILD_M layer 272' is below top surfaces of spacers 214 and top surfaces of gate hard mask layers 220. In the depicted embodiment, the top surface of ILD_M layer 272' is below top surfaces of S/D contacts 260, though the present disclosure contemplates embodiments, where the top surface of ILD_M layer 272' is above top surfaces of S/D contacts 260. A thickness of ILD_M layer 272' along the z-direction, i.e. TM, is about 0.5 nm to about 50 nm. As depicted in FIG. 8D, recessing second ILD layer 272 modifies central void 273M into a central void 273C defined by a recessed portion of a top surface of ILD_M layer 272'. Central void 273C is disposed in a top middle portion of ILD_M layer 272'. Referencing FIG. 8D, central voids 273C are defined between the top surface of ILD_M layer 272' and the surrounding ILD_M layer 272' bulk volume.

Now referring to FIG. 1, FIGS. 9A-9D, and FIGS. 10A-10D, at operation 112, a third ILD layer 274 is processed to form an ILD Upper (ILD_U) layer 274' over ILD_M layer 272'. ILD_U layer 274' forms the upper layer of tri-layer ILD layer 278 as shown in FIG. 12B. Turning to FIGS. 9A-9D, third ILD layer 274 fills openings 228, and is disposed on ILD_M layer 272'. Third ILD layer 274 includes a material different from ILD_M layer 272', gate hard mask layer 220, and S/D hard mask layer 265. Using a different material for ILD layer 274 imparts ILD_U layer 274' with different etching selectivity compared to ILD_M layer 272', gate hard mask layer 220, and S/D hard mask layer 265. In other embodiments, material of ILD_M layer 272', material of gate hard mask layer 220, and material of source/drain hard mask layer 265 may match each other (having matching etching selectivity). In that case, material of third ILD layer 274 would still include a material different from ILD_M layer 272', gate hard mask layer 220, and S/D hard mask layer 265 in order to maintain etching selectivity. Third ILD layer 274 includes any suitable material, for example, SiC, LaO, AlO, AlON, ZrO, HfO, SiN, Si, ZnO, ZrN, ZrAlO, TiO, TaO, YO, TaCN, ZrSi, SiOCN, SiOC, SiCN, HfSi, LaO, SiO, other suitable material, or combinations thereof. Third ILD layer 274 is formed over substrate 202 by any suitable process. For example, a deposition process may be performed to form second ILD layer 272. The deposition process may include CVD, PVD, ALD, HDPCVD, MOCVD, RPCVD, PECVD, LPCVD, ALCVD, APCVD, plating, other suitable methods, or combinations thereof.

Figure 10A:
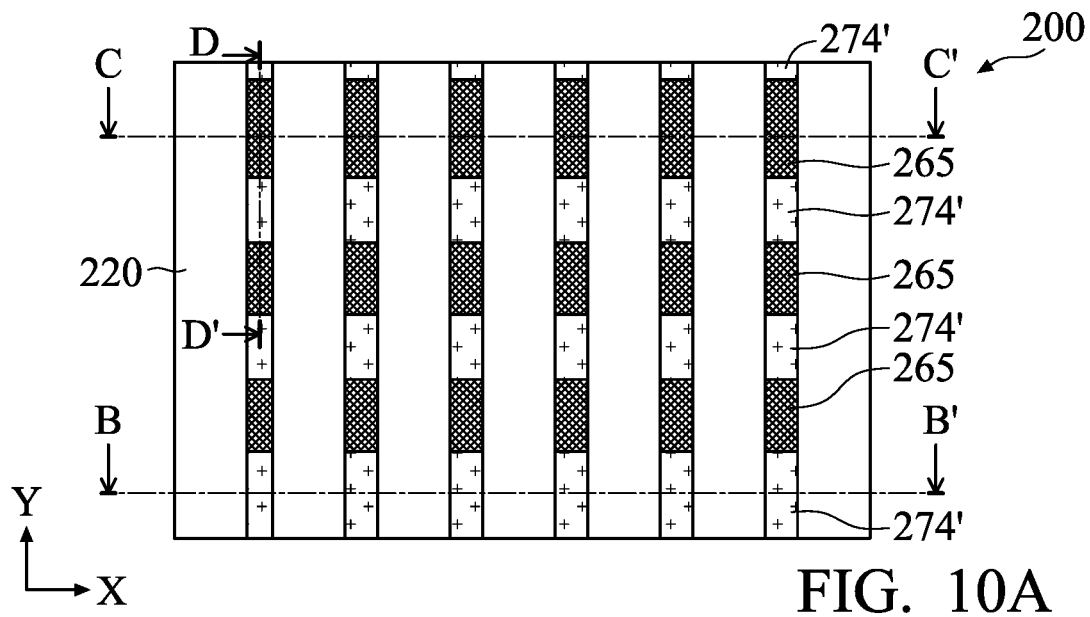
Figure 10B:
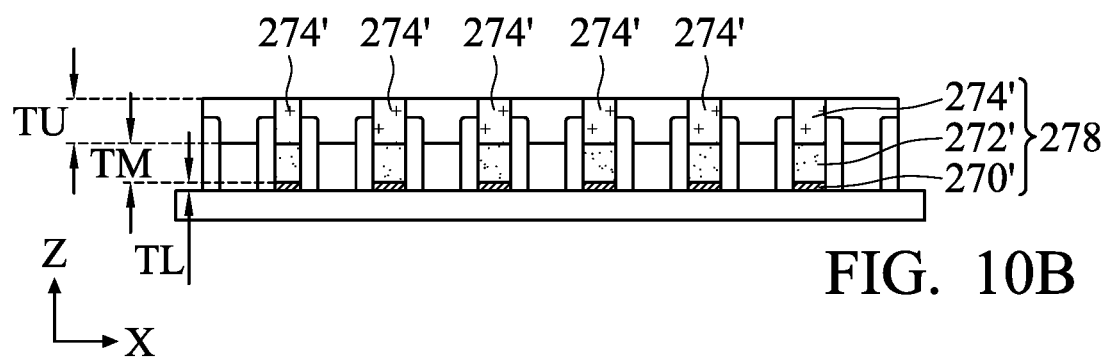
Figure 10C:
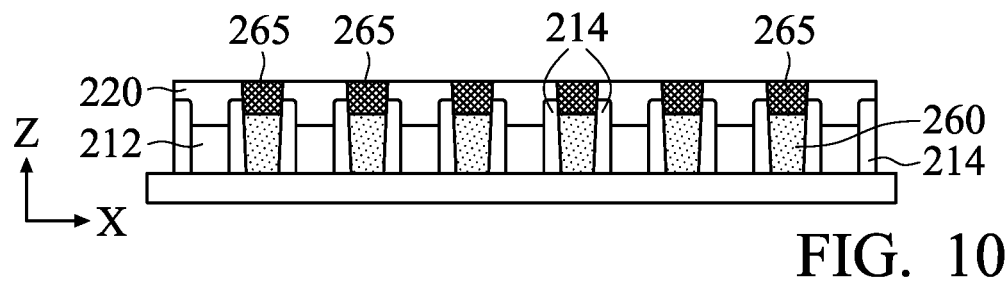
Figure 10D:
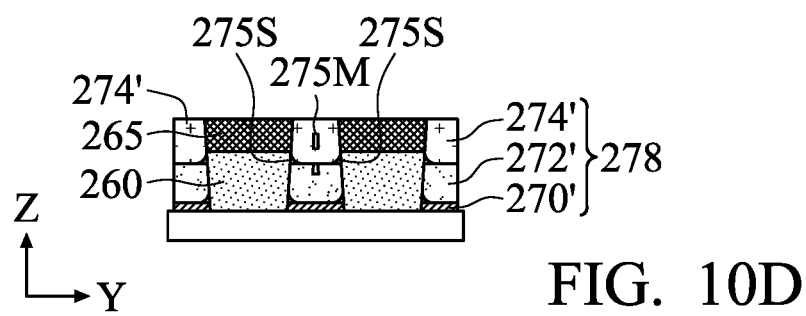
Figure 11A:
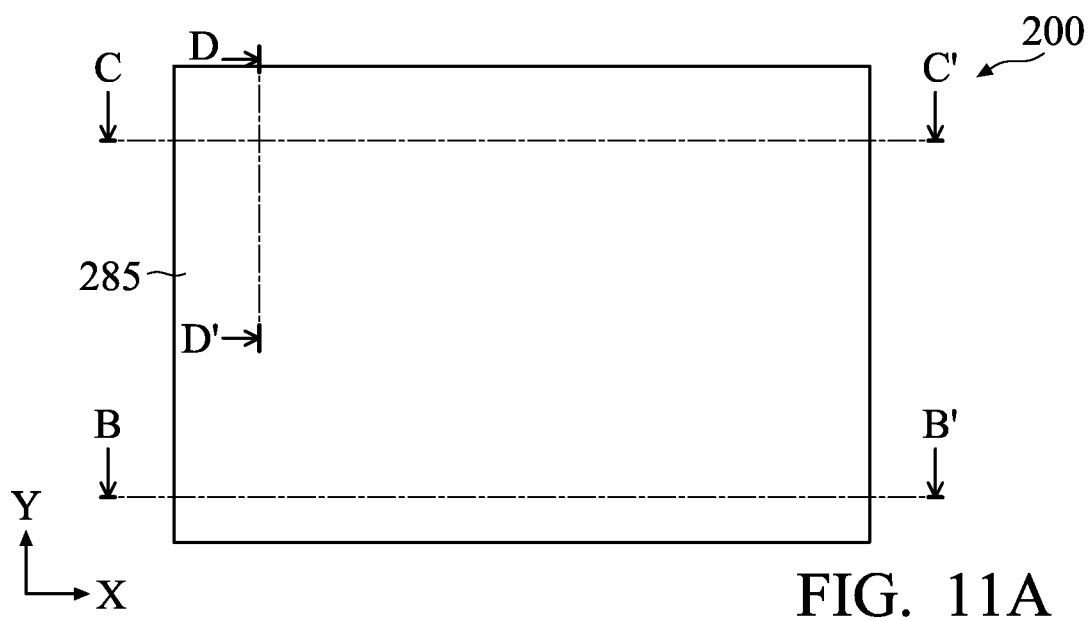
Figure 11B:
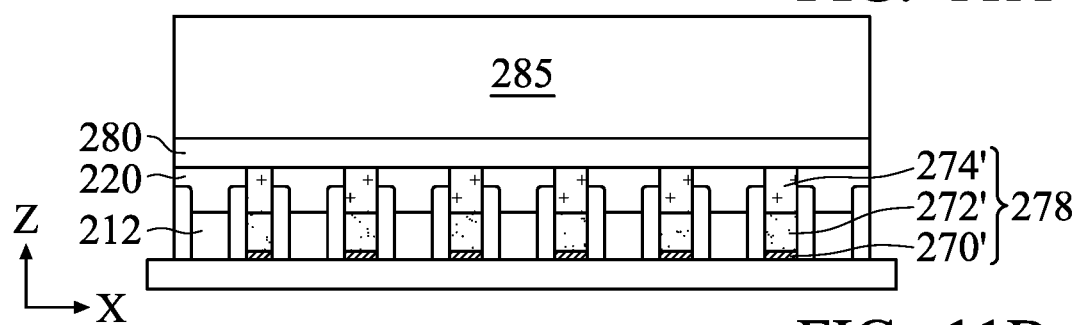
Figure 11C:
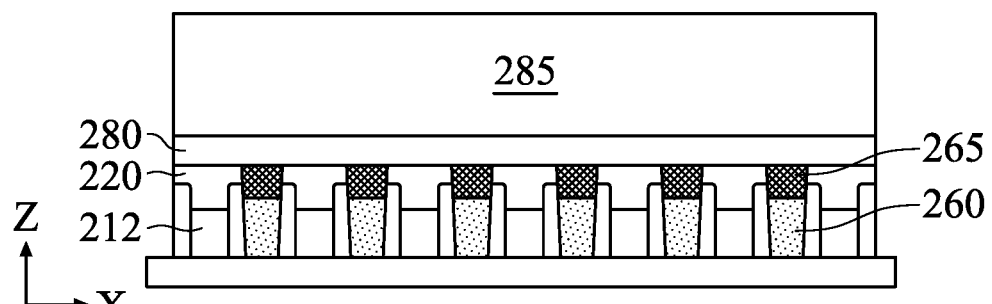
Figure 11D:
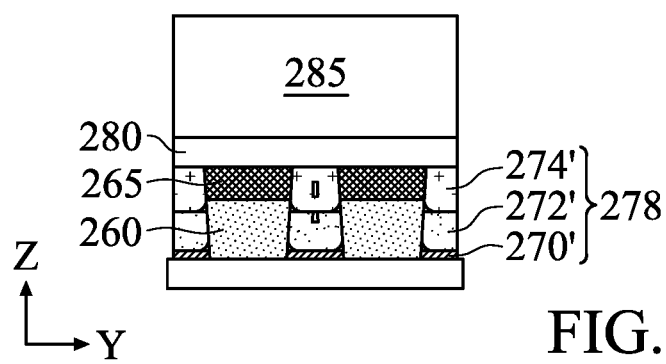

Now referring to FIGS. 10D and 16, in some embodiments, one or more central voids 275M and boundary voids 275S may occur during deposition of third ILD layer 274, specifically when opening 228 has a shape of trapezoid in the y-z plane. In some embodiments, central voids 275M may occur in the middle, or center, of opening 228 when filling in the material of third ILD layer 274. Central voids 275M are formed when the middle of openings 228 are not completely filled by third ILD layer 274. In some other embodiments, boundary voids 275S may occur at the bottom side corners of opening 228 when filling in the material of third ILD layer 274. Boundary voids 275S are formed when corners of openings 228 are not completely filled by third ILD layer 274. Boundary voids 275S are defined between S/D contacts 260 and/or S/D hard mask layers 265, ILD_M layers 272', and third ILD layer 274. In yet some other embodiments, central voids 275M and boundary voids 275S may occur in the middle of opening 228 and at the bottom side corners of opening 228, respectively, when filling in the material of third ILD layer 274. Central voids 275M and boundary voids 275S may have a width in the y-direction and a height in the z-direction. The width of central voids 275M and boundary voids 275S is 0 nm to about 30 nm; and, the height of central voids 275M and boundary voids 275S is 0 nm to about 30 nm. A distance of a bottom surface of central void 275M to the top surface of ILD_L layer 270' in the z-direction is 0 nm to about 70 nm. A relatively slow deposition process or a high temperature deposition process (for example, a deposition at temperature of about 150° C. to about 550° C.) may reduce the occurrence of central voids 275M and boundary voids 275S.

Referring to FIGS. 1 and 10A-10D, still at operation 112, any excess material(s) of third ILD layer 274 may be removed by a planarization process, such as a CMP process or an etching process, thereby planarizing a top surface of device 200. In some embodiments, the planarization process is performed to remove excess third ILD layer 274, such as third ILD layer 274 disposed over gate hard mask layers 220 and S/D hard mask layers 265, thereby exposing top surfaces of gate hard mask layers 220 and top surfaces of source/drain hard mask layers 265. A remaining portion of third ILD layer 274 is referred to as ILD Upper (ILD_U) layer 274'. A top surface of ILD_U layer 274' is substantially planar with top surfaces of gate hard mask layers 220 and top surfaces of S/D hard mask layers 265. In some embodiments, along the z-direction, the top surface of ILD_U layer 274' is higher than top surface of spacers 214. In some embodiments, a thickness of ILD_U layer 274' along the z-direction, i.e. TU, is about 0.5 nm to about 50 nm.

Accordingly, ILD_L layer 270', ILD_M layer 272', and ILD_U layer 274' together form a tri-layer ILD layer 278 in device 200. In the depicted embodiment, the tri-layer ILD layer 278 is a bottommost ILD layer (ILD0) of the MLI structure. As described below, configuring a device-level ILD layer of the MLI structure as tri-layer ILD layer increases processing flexibility when forming vias to S/D contacts 260 and/or metal gates 212. A top surface of the tri-layer ILD feature (top surface of ILD_U layer 274') is higher than a top surface of spacers 214 in the z-direction and is substantially the same height as gate hard mask layer 220 and S/D hard mask layer 265. In some embodiments, a proper thickness ration between each two layers of the tri-layer ILD layer should be considered according to the design requirements of device 200. For example, a thickness ratio of ILD_L layer 270' to ILD_M layer 272' is about 10% to 250%; a thickness ratio of ILD_L layer 270' to ILD_U layer 274' is about 10% to 250%; and a thickness ratio of ILD_M layer 272' to ILD_U layer 274' is about 30% to 300%. If the thickness of the bottom layer is too large, it may not provide enough space for the middle layer (which should be below the top surface of the spacers) and the upper layer (which should has a portion below the spacers); if the thickness of the middle layer (ILD_M layer 272') is too large, it may not be below the top surface of the spacer; and if the thickness of the upper layer (ILD_U layer 274') is too large, it may limit the thickness of the middle layer to provide enough contact to contact TDDB window. And, the thickness of each layer cannot be too small to make the thickness control too difficult. Also, the thickness of the bottom layer should be large enough to provide isolation between gates; the thickness of the middle layer should be large enough to provide enough contact to contact TDDB window; and the thickness of the upper layer should be large enough such that the upper layer can extend from below the top surface of the spacers to above the top surface of the spacers to provide different etching selectivity than the hard mask layer.

Now referring to FIGS. 1 and 11A-11D, at operation 114, an etch stop layer (ESL) 280 is formed over tri-layer ILD layer 278. In some embodiments, ESL 280 includes a dielectric material, such as a material that includes silicon and nitrogen (for example, SiN or SiON). Also at operation 114, a fourth ILD layer 285 is formed over ESL 280. In some embodiments, fourth ILD layer 285 includes a dielectric material including, for example, SiO, SiN, SiON, TEOS formed oxide, PSG, BPSG, low-k dielectric material (K<3.9), other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. Fourth ILD layer 285 includes a dielectric material different than ESL 280. In some embodiments, where ESL 280 includes silicon and nitride, fourth ILD layer 285 includes a low-k dielectric material different than the dielectric material of ESL 280. In some embodiments, fourth ILD layer 285 may have a multilayer structure having multiple dielectric materials. Fourth ILD layer 285 and/or ESL 280 are formed over substrate 202, for example, by a deposition process (such as CVD, FCVD, PVD, ALD, HDPCVD, MOCVD, RPCVD, PECVD, LPCVD, ALCVD, APCVD, plating, other suitable methods, or combinations thereof). Subsequent to the deposition of ESL 280 and/or fourth ILD layer 285, a CMP process and/or other planarization process is performed to planarize the top surface of device 200.

Figure 12D:
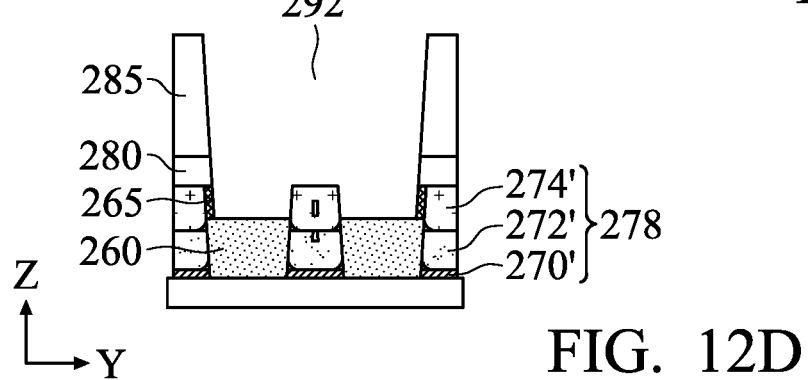

Now referring to FIGS. 1 and 12A-12D, at operation 116, gate contact openings 290 and/or S/D contact openings 292 are formed through fourth ILD layer 285 and ESL 280. Contact openings 290 and 292 are formed by any suitable process including various photolithography, and/or etching processes. An exemplary photolithography process includes forming a photoresist layer (resist) overlying fourth ILD layer 285, exposing the resist to a pattern, performing a post-exposure bake process, and developing the resist to form a masking element including the resist. The masking element is then used to etch the contact openings 290 and 292 into fourth ILD layer 285 and ESL 280. Thereafter, the masking element is removed to expose fourth ILD layer 285. Alternatively, double patterning and/or multiple patterning processes can be implemented to form gate contact openings 290 and/or S/D contact openings 292. A selective etching process is then performed to remove gate hard mask layer 220 exposed in gate contact opening 290. The etching process to selectively etch gate hard mask layer 220 relative to ILD_U layer 274' can be referred to as slot Vg etching, shown in FIG. 12B. Selective etching is also performed to remove S/D hard mask layer 265 exposed in S/D contact opening 292. The etching process to selectively etch S/D hard mask layer 265 relative to ILD_U layer 274' can be referred to as slot Vd etching, shown in FIG. 12D. The slot Vg and/or slot Vd etching process can include a dry etching process (for example, a reactive ion etching (RIE) process), a wet etching process, other suitable etching process, or combinations thereof. Portions of gate hard mask layer 220 and/or S/D hard mask layer 265 may or may not remain based on the mask element used to selectively etch gate hard mask layer 220 and/or S/D hard mask layer 265. For example, as depicted in FIG. 12B showing slot Vg etching, gate hard mask layer 220 exposed in gate contact opening 290 is completely removed. However, as depicted in FIG. 12D showing slot Vd etching, side portions of the respective S/D hard mask layer 265 exposed in S/D contact opening 292 remain after the selective etching process since these side portions are covered by the masking element. The patterned resist layer can be removed before or after the etching process. In some embodiments, the exposure process can implement maskless lithography, electron-beam writing, ion-beam writing and/or nanoprint technology.

Conventional semiconductor devices implement a one-layer ILD layer (for example, only ILD layer 270) as the device-level (bottommost) dielectric layer of the MLI structure. It has been observed that metal bridging issues arise from such configurations due to the resolution limit and the insufficient etching selectivity between the one-layer ILD layer and gate hard mask layers and/or S/D hard mask layers. For example, in the conventional semiconductor structure, due to the scaling down of IC dimensions, pattern shifting may be happened during fabrication. Since no sufficient etching selectivity is provided between the gate hard masks (e.g. 220) and the ILD layer (e.g. 270), the slot Vg etching process at operation 116 to form the gate opening 290 will not only remove gate hard mask layers, but also a top portion of the ILD layer. Similar situation may happen when removing the S/D hard masks (e.g. 265), i.e. a top portion of the ILD layer may also be removed. Therefore, the one-layer ILD layer is recessed, unintentionally forming openings between adjacent spacers 214 (in other words, a height of the one-layer ILD layer in the z-direction is lower than a height of spacers 214). This will cause metal bridge issues after depositing the metal material(s) in the contact openings to form vias to the metal gates and/or S/D contacts, because metal material will fill the openings between adjacent spacers 214 and may interconnect the vias and the metal gates and/or S/D contacts.

However, the tri-layer structure of the device-level ILD layer in the present disclosure can provide sufficient etching selectivity between the device-level ILD layer and the gate (or S/D) hard mask to mitigate the metal bridge issues. In some embodiment, it may also improve the contact to contact TDDB window. As depicted in FIG. 12B for slot Vg etching and 12D for slot Vd etching, since device 200 includes tri-layer ILD layer 278 (including ILD_L layer 270', ILD_M layer 272', and ILD_U layer 274') and the material of ILD_U layer 274' includes a material having different etching selectivity than gate hard mask layer 220 and S/D hard mask layer 265, the selective etching process only removes gate hard mask layers 220 exposed in gate contact opening 290 and S/D hard mask layers 265 exposed in S/D contact openings 292, for each of slot Vg etching and slot Vd etching, respectively. The tri-layer ILD layer 278 is substantially unaffected either by the slot Vg etching process used to remove gate hard mask layer 220 exposed in gate contact opening 290, or by the slot Vd etching process used to remove S/D hard mask layer 265 exposed in S/D contact opening 292. That is, a height of the tri-layer ILD layer 278 in the z-direction is greater than a height of spacers 214, such that a top surface of the tri-layer ILD layer 278 is above top surfaces of spacers 214. Therefore, metal material formed in gate opening 290 and/or S/D contact openings 292 is not formed between adjacent spacers 214, preventing the metal bridge issues observed with one-layer ILD layers. In addition, the material of ILD_M layer 272' in the tri-layer ILD layer can be used to improve the contact to contact TDDB window, thereby extending the life of device 200. Therefore, the tri-layer structure of the device-level ILD layer provides more manufacturing flexibility to not only mitigate the metal bridge issue, but also improve the TDDB window of the device.

Figure 13A:
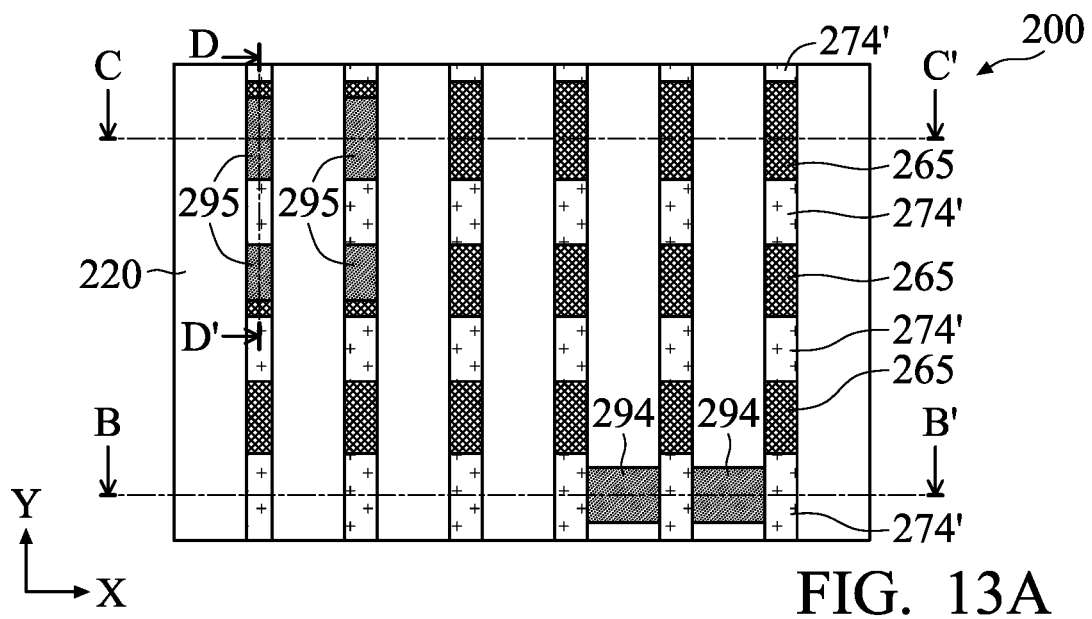
Figure 13B:
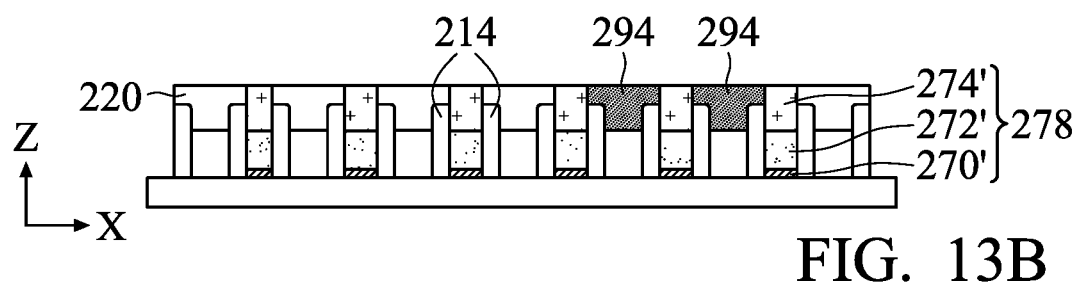
Figure 13C:
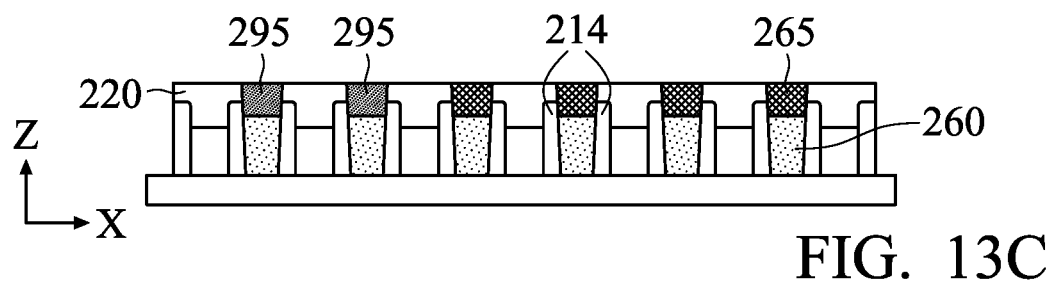
Figure 13D:
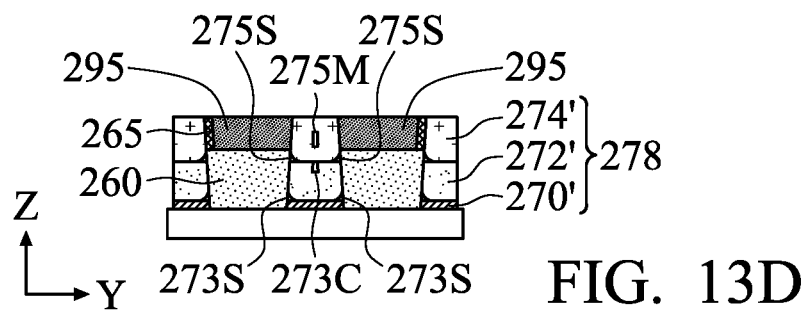
Figure 14A:
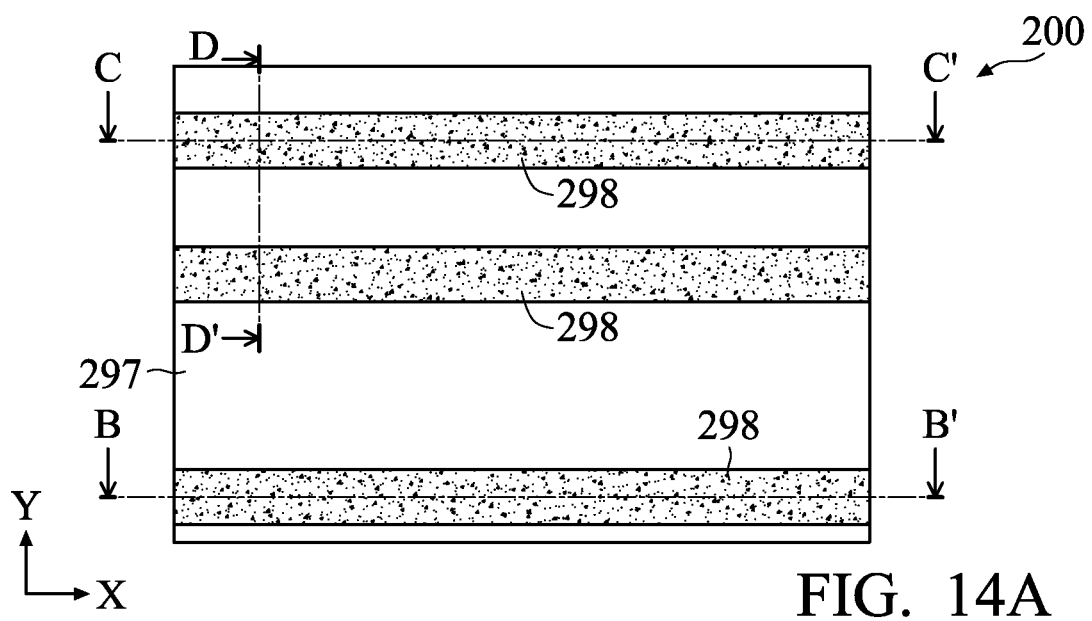
Figure 14B:
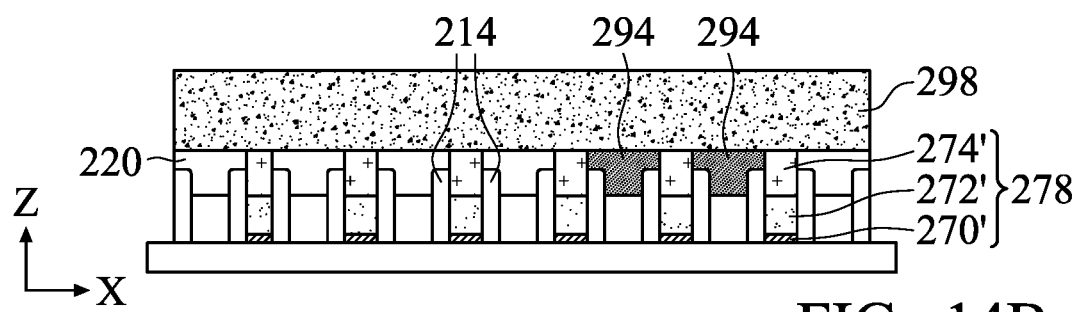
Figure 14C:
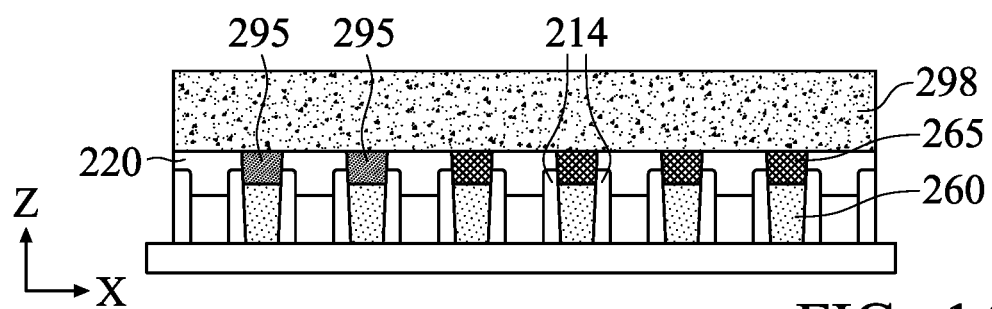
Figure 14D:
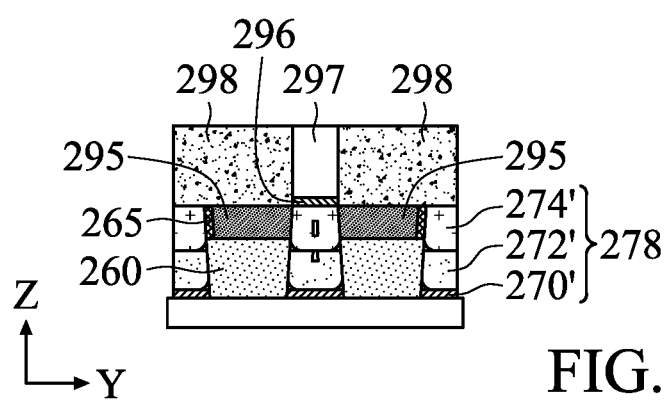

Now referring to FIGS. 1 and 13A-13D, at operation 118, metal materials are filled in gate contact openings 290 and/or S/D contact openings 292 to form gate vias 294 and/or S/D vias 295. Vias 294 and 295 are portions of the MLI feature that electrically couples various devices and/or components of device 200. Vias 294 and 295 may include any suitable electrically conductive material, such as Ta, Ti, Al, Cu, Co, W, TiN, TaN, other suitable conductive materials, or combinations thereof. Various conductive materials can be combined to provide vias 294 and 295 with various layers, such as one or more barrier layers, adhesion layers, liner layers, bulk layers, other suitable layers, or combinations thereof. Vias 294 and 295 are formed by filling contact openings 290 and 292 with one or more conductive materials. The conductive material(s) can be deposited by PVD, CVD, ALD, electroplating, electroless plating, other suitable deposition process, or combinations thereof. Thereafter, one or more polishing processes (for example, CMP) may be performed to remove the top portion of vias 294 and 295 and to remove ESL 280 and fourth ILD layer 285. This results in the top surface of device 200 being planarized down to a level of the top surfaces of gate hard mask layers 220, ILD_U layer 274', S/D contact hard mask layer 265, and vias 294 and 295. As depicted in FIG. 13B, each of gate vias 294 includes a top portion and a bottom portion. Sidewalls of the top portions of gate vias 294 directly contact the upper layer 274' of tri-layer ILD layer 278; and sidewalls of the bottom portions of gate vias 294 directly contact the spacers 214. Thereby, gate vias 294 are separated by tri-layer ILD layer 278 as well as the gate spacers 214. Similarly, as depicted in FIG. 13D, sidewalls of S/D vias 295 directly contact the upper layer 274' of tri-layer ILD layer 278. Thereby, S/D vias 295 are separated by tri-layer ILD layer 278.

Now referring to FIGS. 1 and 14A-14D, other processes may be performed to complete the fabrication of device 200. For example, another etch stop layer (ESL) 296 is formed on the top surface of device 200. And, another ILD layer 297 is formed over the ESL 296. Materials and fabrication process of ESL 296 and ILD layer 297 are similar as those discussed above regarding ESL 280 and ILD layer 285 in FIGS. 11A-11D. Conductive lines 298 may then be formed in the ESL 296 and ILD layer 297 as depicted in FIGS. 14A-14D. Conductive material of the metal line 298 may include Ta, TaN, Ti, TiN, Cu, Co, Ru, Mo, W, other conductive material, or combinations thereof. Forming of conductive lines 298 may include several steps, such as photoresist, etching, deposition, etc. Thereafter, a planarization process (e.g. CMP) is performed to planarize the top surface of device 200. Subsequently, further processes are performed. For example, other contacts, vias, conductive lines, and interlayer dielectrics may be formed over the substrate, configured to connect the various features to form a functional circuit that may include one or more semiconductor structures.

Figure 15A:
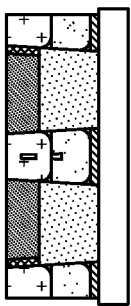
FIGS. 15A-15P illustrate void positions and dimensions of the example semiconductor device.
Figure 15B:
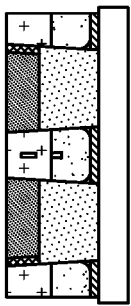
Figure 15C:
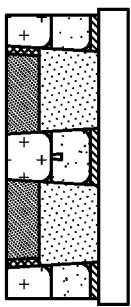
Figure 15D:
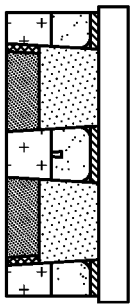
Figure 15E:
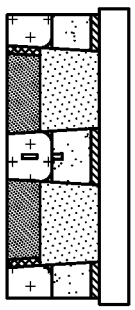
Figure 15F:
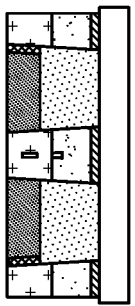
Figure 15G:
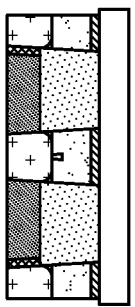
Figure 15H:
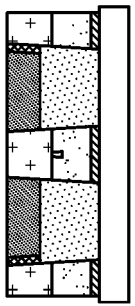
Figure 15I:
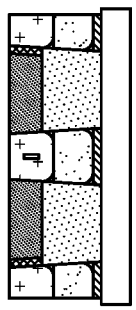
Figure 15J:
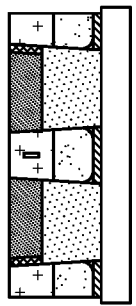
Figure 15K:
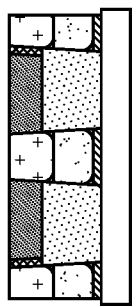
Figure 15L:
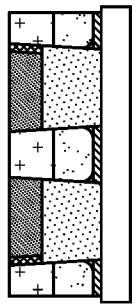
Figure 15M:
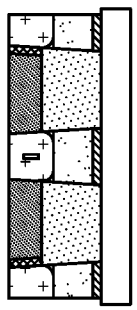
Figure 15N:
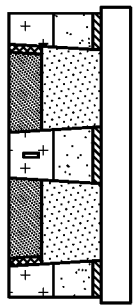
Figure 15O:
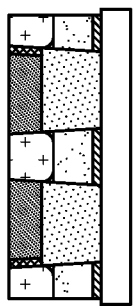
Figure 15P:
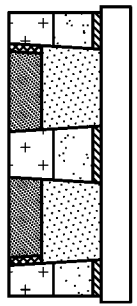

Now referring to FIGS. 15A-15P, different tri-layer ILD layer 278 configurations featuring different voids are illustrated. FIG. 15A includes voids 273C (central void in ILD_M layer 272'), 273S (boundary voids in ILD_M layer 272'), 275M (central void in ILD_U layer 274'), and 275S (boundary voids in ILD_U layer 274'). FIG. 15B includes voids 273C, 273S, 275M but not 275S. FIG. 15C includes voids 273C, 273S, 275S but not 275M. FIG. 15D includes voids 273C, 273S but not 275S, 275M. FIG. 15E includes voids 273C, 275M, 275S but not 273S. FIG. 15F includes voids 273C, 275M but not 273S, 275S. FIG. 15G includes voids 273C, 275S but not 273S, 275M. FIG. 15H includes voids 273C but not 273S, 275M, 275S. FIG. 15I includes voids 273S, 275M, 275S but not 273C. FIG. 15J includes voids 273S, 275M but not 273C, 275S. FIG. 15K includes voids 273S, 275S but not 273C, 275M. FIG. 15L includes voids 273S but not 273C, 275M, 275S. FIG. 15M includes voids 275M, 275S but not 273C, 273S. FIG. 15N includes voids 275M but not 273C, 273S, 275S. FIG. 15O includes voids 275S but not 273C, 273S, 275M. FIG. 15P does not include voids 273C, 273S, 275M, 275S.

Fabrication of device 200 can continue. For example, it may form other contact openings, contact metal, as well as various contacts, vias, wires, and multilayer interconnect features (e.g., metal layers and interlayer dielectrics) over device 200, configured to connect the various features to form a functional circuit that may include one or more multi-gate devices.

Although not intended to be limiting, one or more embodiments of the present disclosure provide many benefits to a semiconductor device and a formation process thereof. For example, embodiments of the present disclosure provide a semiconductor device with a tri-layer ILD feature. Top layer of the tri-layer ILD provides an etching selectivity with the gate hard mask layer and/or S/D hard mask layer. Top layer of the tri-layer ILD also provides an etching selectivity with the middle layer of the three-layer ILD. Compare with one-layer ILD feature, the tri-layer ILD feature is not substantially affected when selective removing the gate hard mask layer and/or S/D hard mask layer exposed in the contact openings during the fabrication. Thus, metal bridge issues caused by the partially removed on-layer ILD feature during the fabrication can be avoided. In addition, the middle layer of the tri-layer ILD feature can improve the contact to contact TDDB window such that to extend the device life.

The present disclosure provides for many different embodiments. Semiconductor device having multi-layer dielectric feature and methods of fabrication thereof are disclosed herein. An exemplary semiconductor device comprises a fin disposed over a substrate and a gate structure disposed over a channel region of the fin, such that the gate structure traverses source/drain regions of the fin. The exemplary semiconductor device further comprises a device-level interlayer dielectric (ILD) layer of a multi-layer interconnect structure disposed over the substrate, wherein the device-level ILD layer includes a first dielectric layer, a second dielectric layer disposed over the first dielectric layer, and a third dielectric layer disposed over the second dielectric layer, and a material of the third dielectric layer is different than a material of the second dielectric layer and a material of the first dielectric layer. The exemplary semiconductor device further comprises a gate contact to the gate structure disposed in the device-level ILD layer and a source/drain contact to the source/drain regions disposed in the device-level ILD layer.

In some embodiments, the exemplary semiconductor device further comprises a material of the second dielectric layer is different than a material of the first dielectric layer. In some embodiments, the gate structure includes a gate electrode and spacers disposed along sidewalls of the gate electrode, the material of the third dielectric layer of the device-level ILD layer is different than a material of the spacers, and the material of the third dielectric layer of the device-level ILD layer is different than a material of the source/drain contacts. In some further embodiments, a top surface of the second dielectric layer of the device-level ILD layer is below a top surface of the spacers of the gate structure and a top surface of the of the third dielectric layer of the device-level ILD layer is above a top surface of the spacers of the gate structure. In some further embodiments, a thickness ratio of the first dielectric layer to the second dielectric layer is about 10% to about 250%, a thickness ratio of the first dielectric layer to the third dielectric layer is about 10% to about 250%, and a thickness ratio of the second dielectric layer to the third dielectric layer is about 30% to about 300%. In some embodiments, the semiconductor device further comprises a S/D hard mask disposed over the S/D contact, wherein the material of the third dielectric layer of the device-level ILD layer is different than a material of the S/D hard mask. And in some embodiments, an etch stop layer disposed between the first dielectric layer of the device-level ILD layer and the substrate.

Another exemplary semiconductor device comprises a fin disposed over a substrate, and a first gate structure and a second gate structure disposed over channel regions of the fin and traversing source/drain regions of the fin, wherein the first gate structure and the second gate structure each include a gate electrode and spacers disposed along sidewalls of the gate electrode. The another exemplary semiconductor device further comprises a S/D contact disposed over at least one of the source/drain regions of the fin and a tri-layer interlayer dielectric (ILD) layer disposed between the first gate structure and the second gate structure, wherein the tri-layer ILD layer includes a lower layer, a middle layer disposed over the lower layer, and an upper layer disposed over the middle layer, wherein the upper layer includes a material different than a material of the lower layer and a material of the middle layer. The another exemplary semiconductor device further comprises gate vias disposed over the gate electrodes of the first gate structure and the second gate structure, wherein the gate vias directly contact the upper layer of the tri-layer ILD layer.

In some embodiments, a top surface of the middle layer of the tri-layer ILD layer is below a top surface of the spacers and a top surface of the upper layer of the tri-layer ILD layer is above a top surface of the spacers. In some embodiments, a material of the middle layer of the tri-layer ILD layer has a different etching selectivity than a material of the lower layer of the tri-layer ILD layer. In some embodiments, the middle layer of the tri-layer ILD layer includes a central void located in a top middle portion of the middle layer of the tri-layer ILD layer. In some embodiments, the middle layer of the tri-layer ILD layer includes a boundary void located in a bottom corner of the middle layer of the tri-layer ILD layer. In some embodiments, the upper layer of the tri-layer ILD layer includes a central void located in a middle portion of the upper layer of the tri-layer ILD layer. In some embodiments, the upper layer of the tri-layer ILD layer includes a boundary void located in a bottom corner portion of the upper layer of the tri-layer ILD layer.

In some embodiments, the another exemplary semiconductor device further comprising a S/D via disposed over the S/D contact, wherein the S/D via directly contacts the upper layer of the tri-layer ILD layer.

An exemplary method includes forming a first dielectric layer over a substrate, wherein a top surface of the first dielectric layer is substantially planar with a top surface of a first gate structure disposed over the substrate and a top surface of a second gate structure disposed over the substrate; recessing the first dielectric layer to form an opening between the first gate structure and the second gate structure, wherein a top surface of the recessed first dielectric layer is lower than the top surface of the first gate structure and the top surface of the second gate structure; forming a second dielectric layer in the opening over the first dielectric layer, wherein a top surface of the second dielectric layer is lower than the top surface of the first gate structure and the top surface of the second gate structure; forming a third dielectric layer in an opening over the second dielectric layer, wherein a top surface of the third dielectric layer is substantially planar with the top surface of the first gate structure and the top surface of the second gate structure, a material of the third dielectric layer is different than a material of the second dielectric layer and the first dielectric layer, and the first dielectric layer, the second dielectric layer, and the third dielectric layer combine to form a device-level interlayer dielectric (ILD) layer.

In some embodiments, each of the first gate structure and the second gate structure include a gate electrode, spacers disposed along sidewalls of the gate electrode, and a gate hard mask layer disposed over the gate electrode and the spacers, wherein a material of the gate hard mask layer and a material of the spacers are different than a material of the first dielectric layer of the device-level ILD layer, and recessing the first dielectric layer includes selectively etching the first dielectric layer to form the opening. In some embodiments, the material of the gate hard mask layer is different than a material of the third dielectric layer of the device-level ILD layer, and the exemplary method further comprises selectively removing the gate hard mask layer of the first gate structure and the second gate structure to form a gate contact opening; depositing a conductive material in the gate contact opening; and planarizing a top surface of the conductive material to expose the third dielectric layer of the device-level ILD layer.

In some embodiments, the exemplary method further comprises forming a source/drain contact over the substrate; and forming a source/drain hard mask layer over the source/drain contact, wherein the source/drain hard mask layer includes a material different than the material of the third dielectric layer of the device-level ILD layer, and a top surface of the source/drain hard mask layer is substantially planar with the top surface of the first gate structure and the top surface of the second gate structure.

In some embodiments, the exemplary method further comprises selectively removing the source/drain hard mask layer to form a S/D contact opening; depositing a conductive material in the S/D contact opening; and planarizing a top surface of the conductive material to expose the third dielectric layer of the device-level ILD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    an isolation structure disposed over a substrate;
    a fin extending from the substrate and through the isolation structure, wherein the fin has a channel region disposed between a first source/drain region and a second source/drain region and the fin extends lengthwise along a first direction;
    a gate structure disposed over the channel region of the fin, wherein the gate structure extends lengthwise along a second direction that is different than the first direction, the gate structure is disposed between the first source/drain region and the second source/drain region of the fin along the first direction, and the gate structure includes a gate electrode and gate spacers disposed along sidewalls of the gate electrode;
    a device-level interlayer dielectric (ILD) layer of a multilayer interconnect structure disposed over the substrate and the isolation structure, wherein the device-level ILD layer includes:
        a first dielectric layer disposed over the isolation structure,
        a second dielectric layer disposed over the first dielectric layer, and
        a third dielectric layer disposed over the second dielectric layer, wherein a material of the third dielectric layer is different than a material of the second dielectric layer and a material of the first dielectric layer;
    a gate contact to the gate structure;
    a source/drain contact to the first source/drain region; and
    wherein:
        the gate structure, the gate contact, and the source/drain contact are disposed in the device-level ILD layer,
        the first dielectric layer, the second dielectric layer, and the third dielectric layer of the device-level ILD layer each cover a respective portion of sidewalls of the gate spacers, and
        the first dielectric layer, the second dielectric layer, and the third dielectric layer of the device-level ILD layer each cover a respective portion of a sidewall of the source/drain contact.

2. The semiconductor device of claim 1, wherein a material of the second dielectric layer is different than a material of the first dielectric layer.

3. The semiconductor device of claim 1, wherein:
    the material of the third dielectric layer of the device-level ILD layer is different than a material of the gate spacers.

4. The semiconductor device of claim 1, wherein an interface between the second dielectric layer of the device-level ILD layer and the third dielectric layer of the device-level ILD layer is below top surfaces of the gate spacers of the gate structure.

5. The semiconductor device of claim 1, wherein a thickness ratio of the first dielectric layer to the second dielectric layer is about 10% to about 250%, a thickness ratio of the first dielectric layer to the third dielectric layer is about 10% to about 250%, and a thickness ratio of the second dielectric layer to the third dielectric layer is about 30% to about 300%.

6. The semiconductor device of claim 1, wherein the semiconductor device further comprises a source/drain hard mask disposed over the source/drain contact, wherein the material of the third dielectric layer of the device-level ILD layer is different than a material of the source/drain hard mask.

7. The semiconductor device of claim 1, wherein a void is in the device-level ILD layer.

8. A semiconductor device, comprising:
    a fin disposed over a substrate;
    a first gate structure and a second gate structure disposed over channel regions of the fin and traversing source/drain regions of the fin, wherein the first gate structure includes a first gate electrode and first gate spacers disposed along sidewalls of the first gate electrode and the second gate structure includes a second gate electrode and second gate spacers disposed along sidewalls of the second gate electrode;
    a S/D contact disposed over one of the source/drain regions of the fin;
    a tri-layer interlayer dielectric (ILD) layer disposed between the first gate structure and the second gate structure, wherein the tri-layer ILD layer includes:
        a lower layer,
        a middle layer disposed over the lower layer, and
        an upper layer disposed over the middle layer, wherein the upper layer includes a material different than a material of the lower layer and a material of the middle layer;

a first gate via disposed over the first gate electrode of the first gate structure and a second gate via disposed over the second gate electrode of the second gate structure;

wherein the first gate spacers are disposed between the first gate electrode and the lower layer of the tri-layer ILD layer and the first gate spacers are disposed between the first gate electrode and the middle layer of the tri-layer ILD layer;

wherein the second gate spacers are disposed between the second gate electrode and the lower layer of the tri-layer ILD layer and the second gate spacers are disposed between the second gate electrode and the middle layer of the tri-layer ILD layer;

wherein the first gate spacers are disposed between the first gate via and the upper layer of the tri-layer ILD layer and the second gate spacers are disposed between the second gate via and the upper layer of the tri-layer ILD layer; and wherein the first gate via and the second gate via each extend over tops of the first gate spacers and the second gate spacers, respectively, and directly contact the upper layer of the tri-layer ILD layer.

9. The semiconductor device of claim 8, wherein a top surface of the middle layer of the tri-layer ILD layer is below top surfaces of the first gate spacers and top surfaces of the second gate spacers and a top surface of the upper layer of the tri-layer ILD layer is above top surfaces of the first gate spacers and top surfaces of the second gate spacers.

10. The semiconductor device of claim 8, further comprising a S/D via disposed over the S/D contact, wherein the S/D via directly contacts the upper layer of the tri-layer ILD layer.

11. The semiconductor device of claim 8, wherein a material of the middle layer of the tri-layer ILD layer has a different etching selectivity than a material of the lower layer of the tri-layer ILD layer.

12. The semiconductor device of claim 8, wherein the middle layer of the tri-layer ILD layer includes a central void, wherein the central void is located in a top middle portion of the middle layer of the tri-layer ILD layer.

13. The semiconductor device of claim 8, wherein the middle layer of the tri-layer ILD layer includes a boundary void, wherein the boundary void is located in a bottom corner of the middle layer of the tri-layer ILD layer.

14. The semiconductor device of claim 8, wherein the upper layer of the tri-layer ILD layer includes a central void, wherein the central void is located in a middle portion of the upper layer of the tri-layer ILD layer.

15. The semiconductor device of claim 8, wherein the upper layer of the tri-layer ILD layer includes a boundary void, wherein the boundary void is located in a bottom corner portion of the upper layer of the tri-layer ILD layer.

16. A semiconductor device, comprising:
a first source/drain contact to a first source/drain;
a second source/drain contact to a second source/drain;
a tri-layer interlayer dielectric (ILD) layer between the first source/drain contact and the second source/drain contact, wherein the tri-layer ILD layer includes:
a first dielectric layer,
a second dielectric layer disposed over the first dielectric layer,
a third dielectric layer disposed over the second dielectric layer, and
wherein the first dielectric layer has a first etch rate to an etchant, the second dielectric layer has a second etch rate to the etchant, and the third dielectric layer has a third etch rate to the etchant, wherein the first etch rate, the second etch rate, and the third etch rate are different; and
wherein the first source/drain contact and the second source/drain contact each extend entirely through the first dielectric layer of the tri-layer ILD layer, the first source/drain contact and the second source/drain contact each extend entirely through the second dielectric layer of the tri-layer ILD layer, and the first source/drain contact and the second source/drain contact each extend partially through the third dielectric layer of the tri-layer ILD layer, such top surfaces of the first source/drain contact and the second source/drain contact are recessed a distance below a top surface of the third dielectric layer.

17. The semiconductor device of claim 16, wherein the first dielectric layer has a first thickness, the second dielectric layer has a second thickness, and the third dielectric layer has a third thickness, wherein the third thickness is greater than the first thickness and the second thickness is greater than the first thickness.

18. The semiconductor device of claim 16, further comprising a fourth dielectric layer disposed over the first source/drain contact and the second source/drain contact, wherein the fourth dielectric layer has a fourth etch rate to the etchant and the fourth etch rate is different than the third etch rate.

19. The semiconductor device of claim 16, wherein:
the first source/drain contact and the second source/drain contact cover an entirety of a first sidewall and a second sidewall, respectively, of the first dielectric layer;
the first source/drain contact and the second source/drain contact cover an entirety of a first sidewall and a second sidewall, respectively, of the second dielectric layer; and
the first source/drain contact and the second source/drain contact cover a portion of a first sidewall and a second sidewall, respectively, of the third dielectric layer.

20. The semiconductor device of claim 16, wherein at least one void is disposed in the tri-layer ILD layer.

* * * * *